US012751324B2

(12) United States Patent
Chung et al.

(10) Patent No.: US 12,751,324 B2
(45) Date of Patent: Sep. 29, 2026

(54) SEMICONDUCTOR PACKAGE MANUFACTURED THROUGH A THERMOCOMPRESSION PROCESS USING A NON-CONDUCTIVE FILM (NCF)

(71) Applicant: SAMSUNG ELECTRONICS CO., LTD., Suwon-si (KR)

(72) Inventors: Hyunsoo Chung, Suwon-si (KR); Younglyong Kim, Suwon-si (KR); Inhyo Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 457 days.

(21) Appl. No.: 18/217,649

(22) Filed: Jul. 3, 2023

(65) Prior Publication Data

US 2024/0063167 A1 Feb. 22, 2024

(30) Foreign Application Priority Data

Aug. 18, 2022 (KR) ........................ 10-2022-0103479

(51) Int. Cl.
*H10W 90/00* (2026.01)
*H10W 72/00* (2026.01)
(Continued)

(52) U.S. Cl.
CPC ......... *H10W 90/00* (2026.01); *H10W 74/121* (2026.01); *H10W 72/0198* (2026.01);
(Continued)

(58) Field of Classification Search
CPC ......... H01L 24/32; H01L 24/08; H01L 24/16; H01L 24/73; H01L 24/83; H01L 24/96;
(Continued)

(56) References Cited

U.S. PATENT DOCUMENTS 8,604,615 B2 12/2013 Lee et al.
8,901,727 B2 12/2014 Kang et al.
(Continued)

FOREIGN PATENT DOCUMENTS

KR 10-2013-0015885 A 2/2013
KR 10-2019-0087897 7/2019
(Continued)

OTHER PUBLICATIONS

First Office Action issued Feb. 21, 2026 in corresponding Korean Patent Application No. 10-2022-0103479.

*Primary Examiner* — Jasmine J Clark
(74) *Attorney, Agent, or Firm* — Morgan, Lewis & Bockius LLP

(57) ABSTRACT

A semiconductor package includes: a buffer die; a first core die disposed on the buffer die; a second core die disposed on the first core die; a first non-conductive film (NCF) disposed between the first core die and the second core die and bonding the first core die and the second core die to each other; a first molding layer at least partially surrounding a side surface of the first core die; and a second molding layer surrounding the first NCF and the first molding layer, wherein the first core die, the second core die, and the buffer die are disposed on the second molding layer, wherein a side surface of the first molding layer and a side surface of the first NCF form a coplanar surface.

20 Claims, 28 Drawing Sheets

(51) Int. Cl.
*H10W 74/10* (2026.01)
*H10W 74/15* (2026.01)
*H10W 90/20* (2026.01)

(52) U.S. Cl.
CPC ...... *H10W 72/07332* (2026.01); *H10W 74/15* (2026.01); *H10W 90/297* (2026.01); *H10W 90/722* (2026.01); *H10W 90/724* (2026.01); *H10W 90/732* (2026.01); *H10W 90/792* (2026.01)

(58) Field of Classification Search
CPC . H01L 24/09; H01L 23/3135; H01L 25/0657; H01L 25/105; H01L 2224/08148; H01L 2224/16148; H01L 2224/16225; H01L 2224/32145; H01L 2224/73204; H01L 2224/83203; H01L 2224/06; H01L 2224/07; H01L 2225/06513; H01L 2225/06541; H01L 2225/1431; H10B 80/00
USPC .......................................................... 257/777
See application file for complete search history.

(56) References Cited

U.S. PATENT DOCUMENTS

| | | | | |
|---|---|---|---|---|
| 9,653,430 | B2 | 5/2017 | Kim et al. | |
| 10,043,780 | B2 | 8/2018 | Choi et al. | |
| 10,153,255 | B2 | 12/2018 | Hwang et al. | |
| 10,181,460 | B2 | 1/2019 | Asahi et al. | |
| 10,658,300 | B2 | 5/2020 | Kim et al. | |
| 12,074,141 | B2 * | 8/2024 | Shin | H01L 25/105 |
| 2019/0259743 | A1 * | 8/2019 | Han | H01L 25/0657 |
| 2021/0335628 | A1 | 10/2021 | Zhang et al. | |

FOREIGN PATENT DOCUMENTS

| | | | |
|---|---|---|---|
| KR | 10-2007259 | B1 | 8/2019 |
| KR | 10-2022-0030685 | A | 3/2022 |

* cited by examiner

SEMICONDUCTOR PACKAGE MANUFACTURED THROUGH A THERMOCOMPRESSION PROCESS USING A NON-CONDUCTIVE FILM (NCF)

CROSS-REFERENCE TO RELATED APPLICATION

This application claims priority under 35 U.S.C. § 119 to Korean Patent Application No. 10-2022-0103479, filed on Aug. 18, 2022, in the Korean Intellectual Property Office, the disclosure of which is incorporated by reference herein in its entirety.

TECHNICAL FIELD

The present inventive concept relates to a semiconductor package. More specifically, the present inventive concept relates to a semiconductor package manufactured through a thermocompression process using a non-conductive film (NCF).

DISCUSSION OF THE RELATED ART

The discovery and research of technologies, materials and manufacturing processes has led to rapid advances in computing power and wireless communication technologies. These advancements have made implementation of high-performance transistors possible, and the rate of integration has approximately doubled about every 18 months according to Moore's Law. Lightweight, compact, and power efficient systems are goals of the semiconductor manufacturing industry, and at this point in time when economic and physical process limitations may have an impact on development, three-dimensionally integrated packaging is being proposed and is under development.

The development of three-dimensionally integrated devices started with complementary metal-oxide-semiconductor (CMOS) integrated devices presented in 1980, and has been developed through continuous research and development for 30 years. Generally, three-dimensional integration technology includes, for example, integration of logic circuits and memory circuits, sensor packaging, and heterogeneous integration of micro-electro-mechanical systems (MEMS) and CMOS. The three-dimensional integration technology may achieve high reliability, low power consumption, and low manufacturing cost as well as reduction of the form factor and size.

SUMMARY

The present inventive concept provides a semiconductor package with increased reliability and a method of manufacturing the same.

According to an embodiment of the present inventive concept, a semiconductor package includes: a buffer die; a first core die disposed on the buffer die; a second core die disposed on the first core die; a first non-conductive film (NCF) disposed between the first core die and the second core die and bonding the first core die and the second core die to each other; a first molding layer at least partially surrounding a side surface of the first core die; and a second molding layer surrounding the first NCF and the first molding layer, wherein the first core die, the second core die, and the buffer die are disposed on the second molding layer, wherein a side surface of the first molding layer and a side surface of the first NCF form a coplanar surface.

According to an embodiment of the present inventive concept, a semiconductor package includes: a buffer die; a first core die disposed on the buffer die; a second core die disposed on the first core die; a non-conductive film (NCF) disposed between the first core die and the second core die and bonding the first core die and the second core die to each other; a first molding layer at least partially surrounding a side surface of the second core die; and a second molding layer that surrounds the NCF and the first molding layer and molds the first core die, the second core die, and the buffer die, wherein a side surface of the first molding layer and a side surface of the NCF form a coplanar surface.

According to an embodiment of the present inventive concept, a semiconductor package includes: a buffer die; a core die stack disposed on the buffer die, and including a first core die disposed on the buffer die, a second core die disposed on the first core die, and a third core die disposed on the second core die; a non-conductive film (NCF) bonding the core die stack; a first molding layer at least partially surrounding a portion of a side surface of the core die stack; and a second molding layer surrounding the core die stack, the NCF, and the first molding layer, and molding the core die stack and the buffer die, wherein the NCF includes: a first horizontal portion disposed between the first core die and the second core die; a second horizontal portion disposed between the second core die and the third core die; and a vertical portion at least partially surrounding a side surface of the first core die and a side surface of the second core die and connecting the first horizontal portion to the second horizontal portion, and wherein a side surface of the first molding layer and a side surface of the vertical portion of the NCF form a coplanar surface.

BRIEF DESCRIPTION OF THE DRAWINGS

The above and other aspects of the present inventive concept will become more apparent by describing in detail embodiments thereof, with reference to the accompanying drawings, in which.

DETAILED DESCRIPTION OF THE EMBODIMENTS

Figure 1:
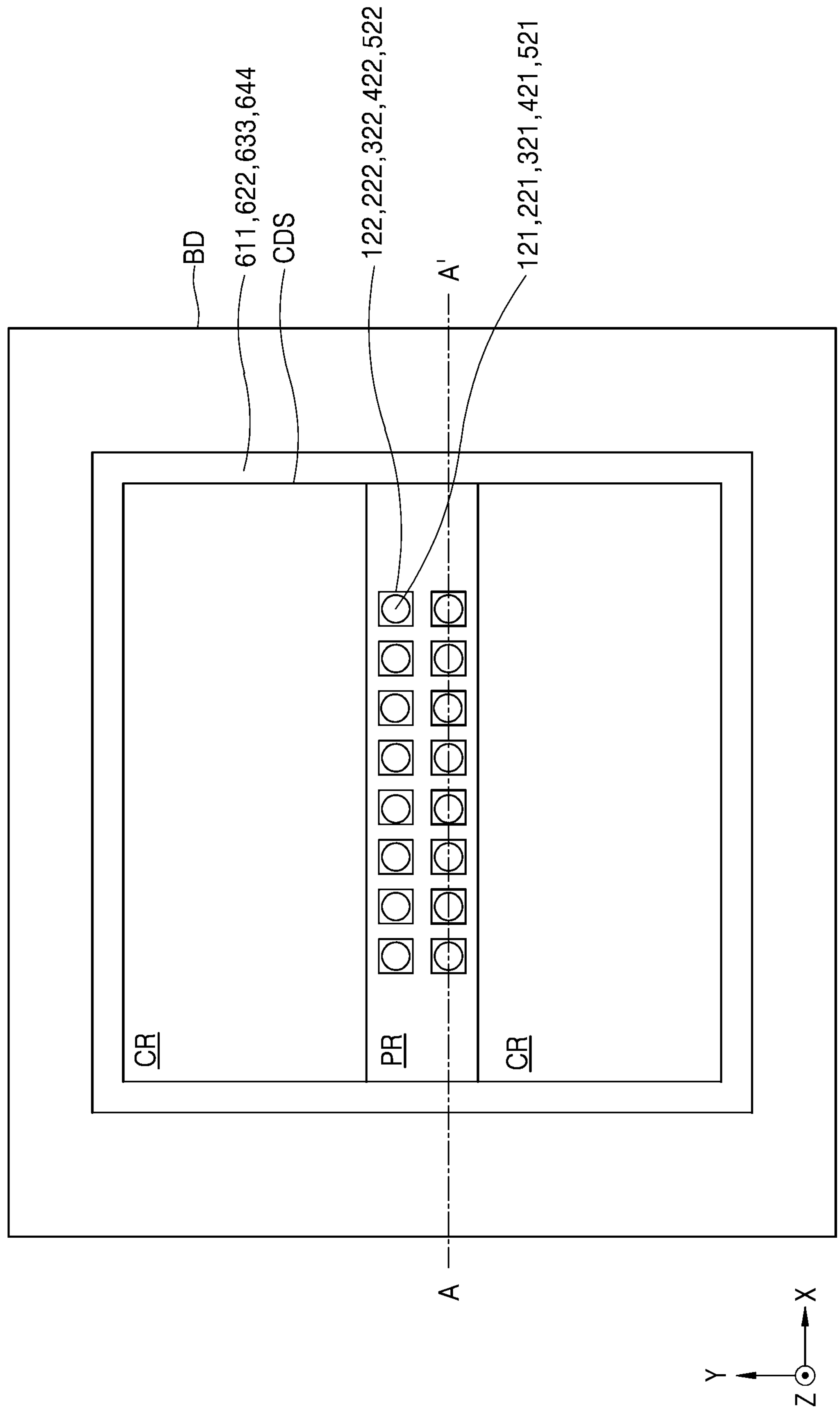
FIG. 1 is a layout diagram illustrating a semiconductor package according to an embodiment of the present inventive concept.

Hereinafter, embodiments of the present inventive concept will be described in detail with reference to the accompanying drawings. The same reference numerals are used for the same components in the drawings, and duplicate descriptions thereof may be omitted or briefly discussed. In the drawings, various thicknesses, lengths, and angles are shown and while the arrangement shown does indeed represent an embodiment of the present inventive concept, it is to be understood that modifications of the various thicknesses, lengths, and angles may be possible within the spirit and scope of the present inventive concept and the present inventive concept is not necessarily limited to the particular thicknesses, lengths, and angles shown.

Figure 2:
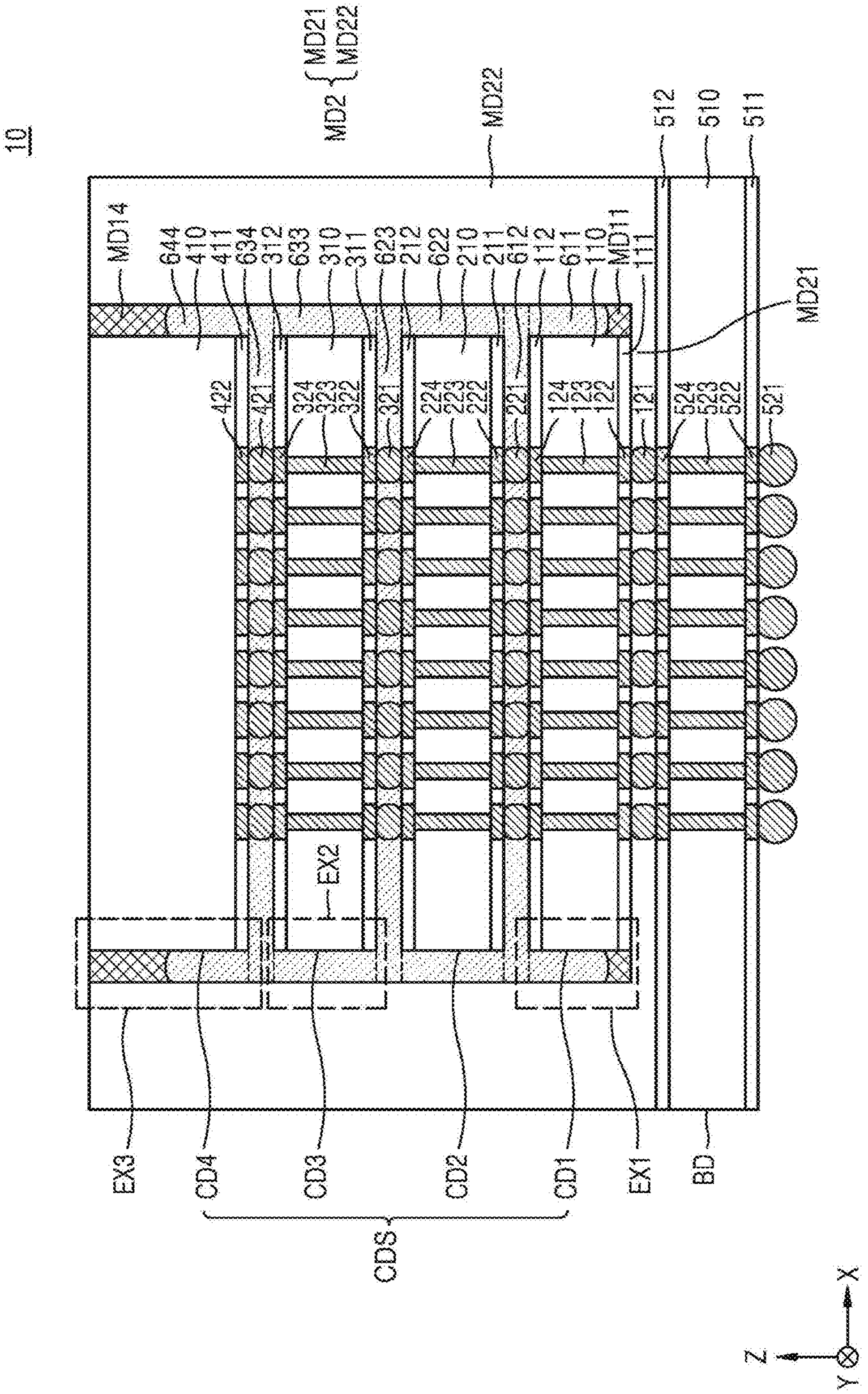
FIG. 2 is a cross-sectional view taken along line A-A' of FIG. 1.
Figure 3A:
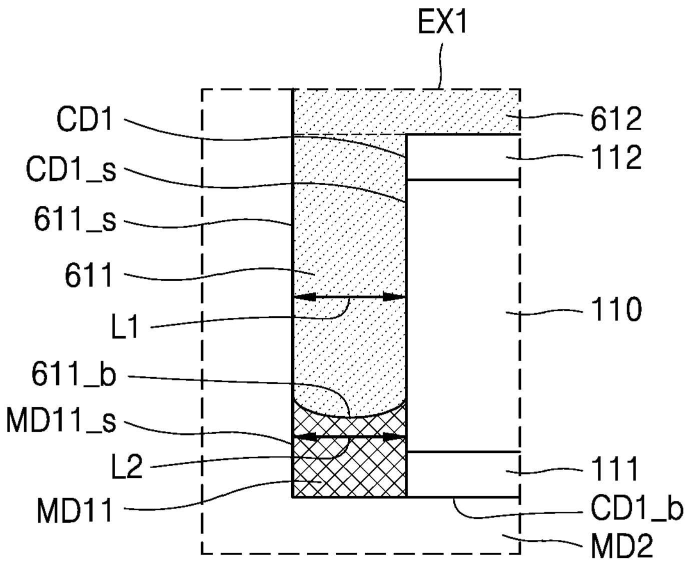
FIGS. 3A, 3B, and 3C are partial cross-sectional views showing enlarged regions EX1, EX2, and EX3 of FIG. 2, respectively.
Figure 3B:
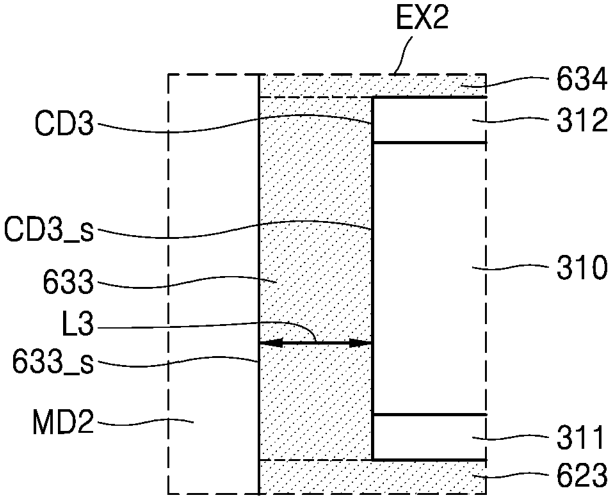
Figure 3C:
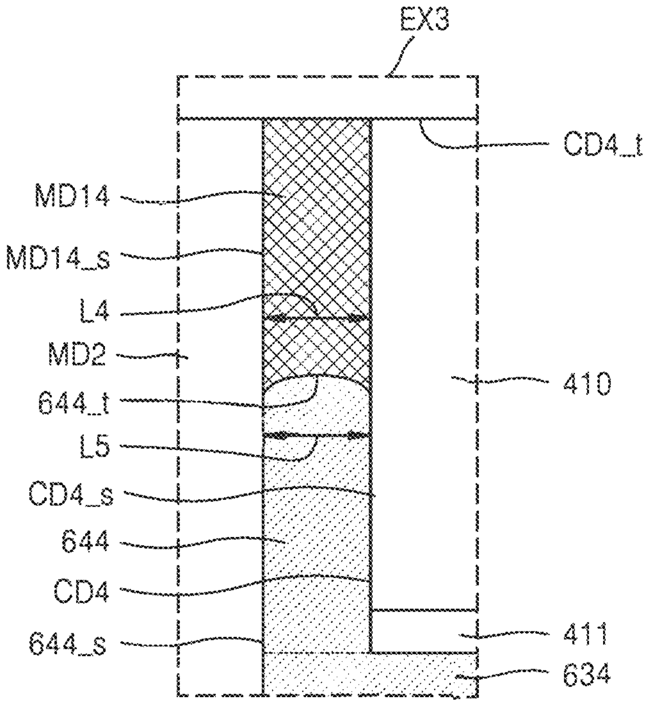

FIG. 1 is a layout diagram illustrating a semiconductor package according to an embodiment of the present inventive concept. FIG. 2 is a cross-sectional view taken along line A-A' of FIG. 1. FIGS. 3A, 3B, and 3C are partial cross-sectional views showing enlarged regions EX1, EX2, and EX3 of FIG. 2, respectively.

Referring to FIGS. 1 and 2, the semiconductor package 10 includes a buffer die BD, a core die stack CDS, and non-conductive films NCFs 611, 612, 622, 623, 633, 634, and 644, first molding layers MD11 and MD14, and a second molding layer MD2. According to some embodiments of the present inventive concept, the semiconductor package 10 illustrated in FIGS. 1 and 2 may be a high bandwidth memory (HBM) including a plurality of DRAM chips and logic chips.

The semiconductor package 10 may include a circuit region CR, in which a circuit is formed, and a pad region PR for electrical connection between the stacked first to fourth core dies CD1, CD2, CD3, and CD4. Although the two circuit regions CR are illustrated as being spaced apart from each other with the pad region PR disposed therebetween in FIG. 1, this illustration is for illustrative purposes only and does not necessarily limit the present inventive concept in any way.

Referring to FIGS. 1 and 2, the pad region PR may be a region in which a plurality of through electrodes 123, 223, 323, 423, and 523, a plurality of pads 122, 222, 322, 422, 522, 124, 224, 324, 424, and 524, and a plurality of solders 121, 221, 321, 421, and 521 are disposed.

The plurality of through electrodes 123, 223, 323, 423, and 523, the plurality of pads 122, 222, 322, 422, 522, 124, 224, 324, 424, and 524, and the plurality of solders 121, 221, 321, 421, and 521 may be arranged in various layouts in a first horizontal direction (e.g., a X direction) and a second horizontal direction (e.g., a Y direction) within the pad region PR. According to some embodiments of the present inventive concept, the plurality of through electrodes 123, 223, 323, 423, and 523, the plurality of pads 122, 222, 322, 422, 522, 124, 224, 324, 424, and 524, and the plurality of solders 121, 221, 321, 421, and 521 may form a matrix while with a preset pitch in the first horizontal direction (e.g., the X direction) and the second horizontal direction (e.g., the Y direction). Referring to FIG. 1, when viewed from above, the planar shape of the plurality of solders 121, 221, 321, 421, and 521 is illustrated substantially as a circular shape, but the present inventive concept is not limited thereto. For example, the planar shape of the first lower solder 121 may be a quadrangle.

In addition, for the convenience of the description, although it is illustrated in FIGS. 1 and 2, as an example, that eight first through electrodes 123, are disposed in the pad region PR in the first horizontal direction (e.g., the X direction), and that two first through electrodes 123 are disposed in the first horizontal direction (e.g., the X direction), the number and arrangement of the first through electrodes 123 are not limited to those shown in FIGS. 1 and 2.

In some embodiments of the present inventive concept, the buffer die BD may be a logic chip. Herein, the logic chip may be any one of a gate array, a cell base array, an embedded array, a structured application-specific integrated circuit (ASIC), a field programmable gate array (FPGA), a complex programmable logic device (CPLD), a central processing unit (CPU), a micro processing unit (MPU), a micro controller unit (MCU), a logic IC, an application processor (AP), a driver driving IC, an RF chip, and a CMOS image sensor. However, the present inventive concept is not limited thereto, and the buffer die BD may be a memory chip.

The buffer die BD may include a buffer substrate 510, a buffer lower insulating film 511, a lower buffer solder 521, a buffer lower pad 522, a buffer upper insulating film 512, a buffer upper pad 524, and a buffer through electrode 523.

In some embodiments of the present inventive concept, the buffer substrate 510 may include silicon (Si). In addition, the buffer substrate 510 may include a semiconductor element such as germanium (Ge), or a compound semiconductor such as silicon carbide (SiC), gallium arsenide (GaAs), indium arsenide (InAs), and indium phosphide (InP). In addition, the buffer substrate 510 may have a silicon on insulator (SOI) structure. For example, the buffer substrate 510 may include a buried oxide (BOX) layer. The buffer substrate 510 may include a conductive region, for example, a well doped with an impurity or a structure doped with an impurity. In addition, the buffer substrate 510 may have various device isolation structures such as a shallow trench isolation (STI) structure.

In some embodiments of the present inventive concept, the buffer substrate 510 may include a plurality of individual devices of various types and an interlayer insulating film. The plurality of individual devices may include various microelectronic devices, for example, metal-oxide-semiconductor field effect transistors (MOSFETs) such as complementary metal-insulator-semiconductor (CMOS) transistors, system large scale integration (LSI), flash memory, dynamic random access memory (DRAM), static random access memory (SRAM), electrically erasable programmable read-only memory (EEPROM), phase-change random access memory (PRAM), magnetoresistive random access memory (MRAM), or resistive random access memory (RERAM), an image sensor such as a CMOS imaging sensor (CIS), micro-electro-mechanical systems (MEMS), an active device, a passive device, and the like. The plurality of individual devices may be formed in the buffer substrate 510 and in the cell region CR, and the plurality of individual devices may be electrically connected to the conductive region of the buffer substrate 510. The buffer substrate 510 may further include at least two of the plurality of individual devices, or a conductive wiring or a conductive plug electrically connecting the plurality of individual devices to the conductive region of the buffer substrate 510. In addition, each of the plurality of individual devices may be electrically isolated from neighboring individual devices by an insulating film.

In some embodiments of the present inventive concept, the buffer substrate 510 may be formed to include a plurality of wiring structures for connecting the plurality of individual devices to other wirings formed on the buffer substrate 510. The plurality of wiring structures may include, for example, a metal wiring pattern, which extends in the horizontal direction, and a via plug, which extends in a vertical direction. The metal wiring pattern and the via plug may each include a barrier film and a conductive layer. The barrier film for wiring may include at least one of, for example, titanium (Ti), titanium nitride (TiN), tantalum (Ta), and/or tantalum nitride (TaN). The conductive layer may include at least one of, for example, tungsten (W), aluminum (Al), and/or copper (Cu). The plurality of wiring structures may have a multilayer structure in which two or more metal wiring patterns and two or more via plugs are alternately stacked. According to some embodiments of the present inventive concept, the buffer lower pad 522 and the buffer upper pad 524 may also include at least one of tungsten (W), aluminum (Al), and/or copper (Cu).

In some embodiments of the present inventive concept, the buffer substrate 510 may have a lower surface and an upper surface opposite to each other, and the buffer lower insulating film 511 may be disposed on the lower surface of the buffer substrate 510. Further, the buffer upper insulating film 512 may be disposed on the upper surface of the buffer substrate 510. In the present specification, the lower surface and upper surface of a substrate may refer to a surface perpendicular to the direction in which the substrate is stacked (i.e., a vertical direction or a Z direction). For example, the lower surface may refer to a surface having a low vertical level, and the upper surface may refer to a surface having a high vertical level. For example, the upper surface may be above the lower surface in the vertical direction. The buffer lower insulating film 511 and the buffer upper insulating film 512 may be protective layers for protecting the buffer substrate 510 and the wiring structure formed in the buffer substrate 510 from external impact or moisture. In some embodiments of the present inventive concept, the buffer lower insulating film 511 and the buffer upper insulating film 512 may include at least one of silicon nitride, silicon oxide, and/or silicon oxynitride.

In some embodiments of the present inventive concept, the buffer lower solder 521 and the buffer lower pad 522 may be disposed on the lower surface of the buffer substrate 510. The buffer lower solder 521 and the buffer lower pad 522 may form a stacked structure. A side surface of the lower buffer pad 522 may be covered by the lower buffer insulating film 511. One surface of the buffer lower pad 522 may be exposed to the outside and be coplanar with the upper surface of the buffer lower insulating film 511. For example, the exposed surface of the buffer lower pad 522 might not be covered by the buffer lower insulating film 511.

In some embodiments of the present inventive concept, a buffer lower solder 521 may be disposed on the buffer lower pad 522 to electrically connect the buffer die BD to an external device. The buffer lower solder 521 may be disposed on the buffer substrate 510 and may be in contact with the buffer lower pad 522. The buffer lower solder 521 may include at least one of, for example, tin (Sn), titanium (Ti), vanadium (V), antimony (Sb), lead (Pb), tungsten (W), chromium (Cr), copper (Cu), nickel (Ni), aluminum (Al), palladium (Pd), silver (Ag), and/or gold (Au).

In some embodiments of the present inventive concept, the buffer lower solder 521 may be a single metal layer or a stacked structure of a plurality of metal layers. For example, the buffer lower solder 521 may include a first metal layer, a second metal layer, and a third metal layer that are sequentially stacked on the buffer lower pad 522. The first metal layer may include a material having excellent adhesion to the buffer lower pad 522 and the buffer lower insulating film 511. For example, the first metal layer may be an adhesive layer for increasing the stability of the formation of the buffer lower solder 521. The first metal layer may include, for example, at least one of titanium (Ti), titanium-tungsten (Ti—W), chromium (Cr), and/or aluminum (Al). The second metal layer may be a barrier layer that prevents the metal material included in the buffer lower solder 521 from diffusing into the buffer substrate 510. The second metal layer may include at least one of, for example, copper (Cu), nickel (Ni), chromium-copper (Cr—Cu), and/or nickel vanadium (Ni—V). The third metal layer may act as a seed layer for forming the buffer lower solder 521 or a wetting layer for increasing wetting characteristics of the buffer lower solder 521. The third metal layer may include at least one of, for example, nickel (Ni), copper (Cu), and/or aluminum (Al).

The buffer lower solder 521 may form the lowermost surface of the semiconductor package 10. In an embodiment of the present inventive concept, the buffer lower solder 521 may be a chip-substrate connection solder for mounting the semiconductor package 10 onto an external substrate or an interposer. In some embodiments of the present inventive concept, the buffer lower solder 521 may be a chip-chip connection solder for mounting the semiconductor package 10 onto an external substrate or an interposer.

The buffer lower solder 521 may include a solder material. The buffer lower solder 521 may include, for example, tin (Sn), indium (In), bismuth (Bi), antimony (Sb), copper (Cu), silver (Ag), zinc (Zn), lead (Pb) and/or alloys thereof. For example, the buffer bottom solder 521 may include Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, and the like.

In some embodiments of the present inventive concept, a buffer upper pad 524 may be disposed on the upper surface of the buffer substrate 510. A side surface of the upper buffer pad 524 may be covered by the upper buffer insulating film 512. One surface of the buffer upper pad 524 may be exposed to the outside and be substantially coplanar with the upper surface of the buffer upper insulating film 512. For example, the one surface of the buffer upper pad 524 might not be covered by the buffer upper insulating film 512. A first lower solder 121 may be disposed on the buffer upper pad 524 to electrically connect the buffer die BD to the core die stack CDS.

In some embodiments of the present inventive concept, a buffer through electrode 523 configured to penetrate the buffer substrate 510 and to be electrically connected to the buffer lower solder 521, the buffer lower pad 522, and the buffer upper pad 524 may be disposed in the buffer substrate 510. The buffer through electrode 523 may penetrate the buffer substrate 510 in the vertical direction (e.g., the Z direction). The buffer through electrode 523 may electrically connect the buffer upper pad 524 to the buffer lower solder 521 and the buffer lower pad 522 to electrically connect the core die stack CDS to an external device.

In some embodiments of the present inventive concept, the buffer through electrode 523 may have a pillar shape. The buffer through electrode 523 may include a barrier film defining a columnar surface and a buried conductive layer filling the inside of the barrier film. The barrier film may, for example, include at least one of titanium (Ti), titanium nitride (TiN), tantalum (Ta), tantalum nitride (TaN), rubidium (Ru), cobalt (Co), manganese (Mn), or tungsten nitride (WN), nickel (Ni), and nickel boronide (NiB), and the buried conductive layer may include at least one of Cu alloys such as Cu, CuSn, CuMg, CuNi, CuZn, CuPd, CuAu, CuRe, and CuW, W, W alloys, Ni, Ru, and Co. In some embodiments of the present inventive concept, the buffer through electrode 523 may be formed on the same level as the buffer substrate 510 and further include a through-via insulating film covering the barrier film. The through-via insulating film may be formed of, for example, an oxide film, a nitride film, a carbon film, a polymer, or a combination thereof.

In some embodiments of the present inventive concept, the first to fourth core dies CD1, CD2, CD3, and CD4 may be, for example, memory semiconductor chips. A memory semiconductor chip may be, for example, a volatile memory semiconductor chip such as a dynamic random access memory (DRAM) chip or a static random access memory (SRAM) chip, or may be a non-volatile memory semiconductor chip such as a phase-change random access memory (PRAM) chip, a magnetoresistive random access memory (MRAM) chip, a ferroelectric random access memory (FeRAM) chip, or a resistive random access memory (ReRAM) chip. According to some embodiments of the present inventive concept, each of the first to fourth core dies CD1, CD2, CD3, and CD4 may be a DRAM semiconductor chip for configuring an HBM.

In FIGS. 1 and 2, a semiconductor package 10 in which first to fourth core dies CD1, CD2, CD3, and CD4 are stacked is exemplarily shown, but the number of semiconductor chips stacked in the semiconductor package 10 is not limited thereto. For example, 2 to 32 semiconductor chips may be stacked in the semiconductor package 10.

In some embodiments of the present inventive concept, the first core die CD1 may be disposed on the buffer die BD. The first core die CD1 may include a first core substrate 110, a first lower insulating film 111, a first lower solder 121, a first lower pad 122, a first upper insulating film 112, a first upper pad 124, and a first through electrode 123.

In some embodiments of the present inventive concept, the first core substrate 110 may include silicon (Si). In addition, the first core substrate 110 may include a semiconductor element such as germanium (Ge), or a compound semiconductor such as silicon carbide (SiC), gallium arsenide (GaAs), indium arsenide (InAs), and indium phosphide (InP). In addition, the first core substrate 110 may have an SOI structure. In addition, the first core die CD1 may have various device isolation structures such as an STI structure.

In some embodiments of the present inventive concept, the first core substrate 110 may have a lower surface and an upper surface facing each other, and the first lower insulating film 111 may be disposed on the lower surface of the first core substrate 110, and the first upper insulating film 112 may be disposed on the upper surface of the first core substrate 110. The first lower insulating film 111 and the first upper insulating film 112 may be protective layers for protecting the first core substrate 110 and the wiring structure formed in the first core substrate 110 from external impact or moisture.

In some embodiments of the present inventive concept, the first lower solder 121 and the first lower pad 122 may be disposed on the lower surface of the first core substrate 110. The first lower solder 121 and the first lower pad 122 may form a stacked structure. A side surface of the first lower pad 122 may be covered by the first lower insulating film 111. One surface of the first lower pad 122 may be exposed to the outside and be substantially coplanar with the upper surface of the first lower insulating film 111. For example, the one surface of the first lower pad 122 might not be covered by the first lower insulating film 111. A first lower solder 121 may be disposed on the first lower pad 122 to electrically connect the first core die CD1 to the buffer die BD. The first lower solder 121 may be disposed on the buffer upper pad 524 of the buffer die BD to electrically connect the first core die CD1 to the buffer die BD. The first lower solder 121 is disposed between the buffer die BD and the first core die CD1 and may include a connection terminal that electrically connects the buffer die BD to the first core die CD1.

In some embodiments of the present inventive concept, a first upper pad 124 may be disposed on the upper surface of the first core substrate 110. A side surface of the first upper pad 124 may be covered by the first upper insulating film 112. One surface of the first upper pad 124 may be exposed to the outside and be substantially coplanar with the upper surface of the first upper insulating film 112. For example, the one surface of the first upper pad 124 might not be covered by the first upper insulating film 112. A second lower solder 221 may be disposed on the first upper pad 124 to electrically connect the first core die CD1 to the second core die CD2.

In some embodiments of the present inventive concept, a first through electrode 123 that is configured to penetrate the first core substrate 110 and to be electrically connected to the first lower solder 121, the first lower pad 122, and the first upper pad 124 may be disposed in the first core substrate 110. The first through electrode 123 may penetrate the first core substrate 110 in a vertical direction (e.g., the Z direction). The first through electrode 123 may electrically connect the first upper pad 124 to the first lower solder 121 and the first lower pad 122 to electrically connect the first core die CD1 to the buffer die BD and/or an external device.

In some embodiments of the present inventive concept, the first lower solder 121 may receive at least one of a control signal, a power supply potential, and a ground potential for operation of the first to fourth core dies CD1, CD2, CD3, and CD4 from the buffer die BD and/or an external device. In addition, the first lower solder 121 may receive data signals, which are to be stored in the first to fourth core dies CD1, CD2, CD3, and CD4, from the buffer die BD and/or an external device, and configure a path for providing data stored in the first to fourth core dies CD1, CD2, CD3, and CD4 to the buffer die BD and/or an external device.

In some embodiments of the present inventive concept, the second core die CD2 may be disposed on the first core die CD1. The second core die CD2 may include a second core substrate 210, a second lower insulating film 211, a second lower solder 221, a second lower pad 222, a second upper insulating film 212, a second upper pad 224, and a second through electrode 223. The second lower solder 221 may contact the first upper pad 124. In some embodiments of the present inventive concept, the second core die CD2 may be substantially the same as the first core die CD1. Since the second core die CD2 may have similar technical characteristics to the first core die CD1, description of the second core die CD2 may be referred to in the description of the first core die CD1, and a detailed description of the second core die CD2 will be omitted.

In some embodiments of the present inventive concept, the third core die CD3 may be disposed on the second core die CD2. The third core die CD3 may include a third core substrate 310, a third lower insulating film 311, a third lower solder 321, a third lower pad 322, a third upper insulating film 312, a third upper pad 324, and a third through electrode 323. The third lower solder 321 may contact the second upper pad 224. Since the third core die CD3 has similar technical characteristics to the first core die CD1, a detailed description thereof will be omitted.

In some embodiments of the present inventive concept, the fourth core die CD4 may be disposed on the third core die CD3. The fourth core die CD4 may include a fourth core substrate 410, a fourth lower insulating film 411, a fourth lower solder 421, and a fourth lower pad 422. The fourth lower solder 421 may contact the third upper pad 324. Since the fourth core die CD4 is a core die of the uppermost layer among the stacked core die stacks CDS, the upper insulating film, the upper pad, and the through electrode may be omitted. Except for omitting the upper insulating film, the upper pad, and the through electrode, the second core die CD2 has similar technical characteristics to the first core die CD1, and thus a detailed description thereof will be omitted.

The second lower solder 221 may be disposed between the first upper pad 124 and the second lower pad 222. The second lower solder 221 may contact each of the first upper pad 124 and the second lower pad 222. Accordingly, the first core die CD1 and the second core die CD2 are configured to be electrically connected to each other. The third lower solder 321 may be disposed between the second upper pad 224 and the third lower pad 322. The third lower solder 321 may contact each of the second upper pad 224 and the third lower pad 322. Accordingly, the second core die CD2 and the third core die CD3 are configured to be electrically connected to each other. The fourth lower solder 421 may be disposed between the third upper pad 324 and the fourth lower pad 422. The fourth lower solder 421 may contact each of the third upper pad 324 and the fourth lower pad 422. Accordingly, the third core die CD3 and the fourth core die CD4 are configured to be electrically connected to each other.

In some embodiments of the present inventive concept, the semiconductor package 10 may include a non-conductive film (NCF) bonding the core die stack CDS. For example, NCFs bonding the first to fourth core dies CD1, CD2, CD3, and CD4 to each other may be disposed between the first to fourth core dies CD1, CD2, CD3, and CD4. The NCF may be disposed to fill between the first to fourth core dies CD1, CD2, CD3, and CD4 and at least partially surround a portion of side surfaces of the first to fourth core dies CD1, CD2, CD3, and CD4. The NCF may include a first horizontal portion 612, a second horizontal portion 623, and a third horizontal portion 634 disposed between the first to fourth core dies CD1, CD2, CD3, and CD4, and a first vertical portion 611, a second vertical portion 622, a third vertical portion 633, and a fourth vertical portion 644 at least partially surrounding a portion of side surfaces of the first to fourth core dies CD1, CD2, CD3, and CD4.

The NCF may be an adhesive film for bonding the first to fourth core dies CD1, CD2, CD3, and CD4 to each other. The NCF may include an insulating material. The first to fourth core dies CD1, CD2, CD3, and CD4 may be bonded by a thermocompression process using the NCF, which will be described later. The NCF may include, for example, a filler.

A first horizontal portion 612 may be disposed between the first core die CD1 and the second core die CD2. The first horizontal portion 612 may bond the first core die CD1 and the second core die CD2 to each other. A second horizontal portion 623 may be disposed between the second core die CD2 and the third core die CD3. The second horizontal portion 623 may bond the second core die CD2 and the third core die CD3 to each other. A third horizontal portion 634 may be disposed between the third core die CD3 and the fourth core die CD4. The third horizontal portion 634 may bond the third core die CD3 and the fourth core die CD4 to each other. The first to third horizontal portions 612, 623, and 634 may fill space between the first to fourth core dies CD1, CD2, CD3, and CD4 and extend in a horizontal direction.

In some embodiments of the present inventive concept, a first vertical portion 611 surrounding a portion of a side surface of the first core die CD1 may be disposed. For example, the first vertical portion 611 surrounding a portion of the side surface of the first core die CD1 may surround the upper portion of the side surface of the first core die CD1. For example, a side surface of the first core die CD1 may be completely covered by the first molding layer MD11 and the first vertical portion 611. For example, the first vertical portion 611 may be disposed on the first molding layer MD11. In some embodiments of the present inventive concept, a second vertical portion 622 surrounding a portion of a side surface of the second core die CD2 may be disposed. For example, a side surface of the second core die CD2 may be completely covered by the second vertical portion 622. In some embodiments of the present inventive concept, a third vertical portion 633 surrounding a portion of a side surface of the third core die CD3 may be disposed. For example, a side surface of the third core die CD3 may be completely covered by the third vertical portion 633. In some embodiments of the present inventive concept, a fourth vertical portion 644 surrounding a portion of a side surface of the fourth core die CD4 may be disposed. For example, the fourth vertical portion 644 surrounding a portion of the side surface of the fourth core die CD4 may surround a lower portion of the side surface of the fourth core die CD4. For example, a side surface of the fourth core die CD4 may be completely covered by the first molding layer MD14 and the fourth vertical portion 644. For example, the first molding layer MD14 may be disposed on the fourth vertical portion 644. The first to fourth vertical portions 611, 622, 633, and 644 surround a portions of side surfaces of the first to fourth core dies CD1, CD2, CD3, and CD4 and may extend in a vertical direction.

In some embodiments of the present inventive concept, the sides of the first core die CD1 and the fourth core die CD4 may be only partially surrounded by the NCFs 611 and 644, and sides of the second core die CD2 and the third core die CD3 may be completely surrounded by the NCFs 622 and 633.

In some embodiments of the present inventive concept, the semiconductor package 10 may include first molding layers MD11 and MD14 surrounding a side surface of the core die stack CDS. For example, the first molding layers MD11 and MD14 surrounding a portion of a side surface of the core die stack CDS may be disposed. For example, the first molding layer MD11 surrounding a portion of the side surface of the first core die CD1 and the first molding layer MD14 surrounding a portion of the side surface of the fourth core die CD4 may be disposed. The first molding layers MD11 and MD14 may include, for example, epoxy mold compound (EMC).

In some embodiments of the present inventive concept, the first molding layer MD11 may surround a lower portion of a side surface of the first core die CD1. In some embodiments of the present inventive concept, the first molding layer MD14 may surround an upper portion of a side surface of the fourth core die CD4.

Referring to FIGS. 3A to 3C, the side surfaces of the first molding layers MD11 and MD14 and the side surfaces of the first to fourth vertical portions 611, 622, 633, and 644 of the NCF may extend in the same direction. In some embodiments of the present inventive concept, a side surface of each of the first molding layers MD11 and MD14 and a side surface of each of the first to fourth vertical portions 611, 622, 633, and 644 of the NCF may be substantially coplanar with one another. This will be described in detail below.

As shown in FIG. 3A, in some embodiments of the present inventive concept, the side surface 611_s of the first vertical portion 611 surrounding the side surface CD1_s of the first core die CD1 and the side surface MD11_s of the first molding layer MD11 may be substantially coplanar with one another. In some embodiments of the present inventive concept, the side surface CD1_s of the first core die CD1 and the side surface 611_s of the first vertical portion 611, which surrounds the first core die CD1, may be parallel to each other. In some embodiments of the present inventive concept, the side surface CD1_s of the first core die CD1 and the side surface MD11_s of the first molding layer MD11, which surrounds the first core die CD1, may be parallel to each other. However, in some embodiments of the present inventive concept, the side surface CD1_s of the first core die CD1 and the side surface 611_s of the first vertical portion 611, which surrounds the first core die CD1, and the side surfaces MD11_s of the first molding layer MD11 might not be parallel to each other.

In some embodiments of the present inventive concept, the horizontal thickness L1 of the first vertical portion 611 surrounding a portion of the side surface CD1_s of the first core die CD1 may be substantially the same as the horizontal thickness L2 of the first molding layer MD11 surrounding a portion of the side surface CD1_s of the first core die CD1. A horizontal thickness L1 of the first vertical portion 611 surrounding a portion of the side surface CD1_s of the first core die CD1 may be about 20 μm or more and about 100 μm or less. The horizontal thickness L2 of the first molding layer MD11 surrounding a portion of the side surface CD1_s of the first core die CD1 may be about 20 μm or less and about 100 μm or more. For example, the horizontal thickness L1 of the first vertical portion 611 and the horizontal thickness L2 of the first molding layer MD11 may be about 50 μm.

A lower surface 611_b of the first vertical portion 611 surrounding the side surface CD1_s of the first core die CD1 may have a convex profile. However, the present inventive concept is not limited thereto, and in some embodiments of the present inventive concept, the lower surface 611_b of the first vertical portion 611 may be parallel to the lower surface CD1_b of the first core die CD1 or may have a concave profile.

The upper surface of the first molding layer MD11 may have a profile complementary to that of the lower surface 611_b of the first vertical portion 611. An upper surface of the first molding layer MD11 may have a concave profile. This may be because the lower surface 611_b of the first vertical portion 611 surrounding the side surface CD1_s of the first core die CD1 has a convex profile, and the first molding layer MD11 surrounds a portion of the side surface CD1_s except for a portion of the side surface CD1_s of the first core die CD1 that is surrounded by the first vertical portion 611. However, the present inventive concept is not limited thereto, and in some embodiments, the upper surface of the first molding layer MD11 may be parallel to the lower surface CD1_b of the first core die CD1 or may have a convex profile.

In some embodiments of the present inventive concept, the upper surface of the first molding layer MD11 and the lower surface of the first vertical portion 611 may be between the upper surface and the lower surface of the first core die CD1.

As illustrated in FIG. 3B, a side surface 633_s of the third vertical portion 633 may be parallel to a side surface CD3_s of the third core die CD3. The side surface 633_s of the third vertical portion 633 may be substantially coplanar with the side surface 611_s of the first vertical portion 611 surrounding a part of the side surface CD1_s of the first core die CD1 shown in FIG. 3A. In some embodiments of the present inventive concept, the horizontal thickness L3 of the third vertical portion 633 surrounding the side surface CD3_s of the third core die CD3 may be substantially the same as the horizontal thickness L1 of the first vertical portion 611 surrounding a portion of the side surface CD1_s of the first core die CD1 illustrated in FIG. 3A. This may be the same for the second vertical portion 622 surrounding the side surface CD2_s of the second core die CD2, and accordingly, a detailed description of the second vertical portion 622 surrounding the side surface CD2_s of the second core die CD2 will be omitted.

As shown in FIG. 3C, a side surface 644_s of the fourth vertical portion 644 surrounding the side surface CD4_s of the fourth core die CD4 and a side surface MD14_s of the first molding layer MD14 may be substantially coplanar with one another. In some embodiments of the present inventive concept, the side surface CD4_s of the fourth core die CD4 and the side surface 644_s of the fourth vertical portion 644 surrounding the fourth core die CD4 may be parallel to each other. In some embodiments of the present inventive concept, the side surface CD4_s of the fourth core die CD4 and the side surface MD14_s of the first molding layer MD14 surrounding the fourth core die CD4 may be parallel to each other.

In some embodiments of the present inventive concept, the side surface 644_s of the fourth vertical portion 644 surrounding the side surface CD4_s of the fourth core die CD4 may be substantially coplanar with the side surface 611_s of the first vertical portion 611 surrounding a portion of the side surface CD1_s of the first core die CD1 illustrated in FIG. 3A. For example, the side surface 644_s of the fourth vertical portion 644 surrounding the side surface CD4_s of the fourth core die CD4 may also be substantially coplanar with the side surface 633_s of the third vertical portion 633 surrounding the side surface CD3_s of the third core die CD3 illustrated in FIG. 3B.

In some embodiments of the present inventive concept, the horizontal thickness L5 of the fourth vertical portion 644 surrounding the side surface CD4_s of the fourth core die CD4 may be substantially the same as each of the horizontal thickness L1 of the first vertical portion 611 surrounding a portion of the side surface CD1_s of the first core die CD1, shown in FIG. 3A, and the horizontal thickness L3 of the third vertical portion 633 surrounding the side surface CD3_s of the third core die CD3.

In some embodiments of the present inventive concept, the horizontal thickness L5 of the fourth vertical portion 644 surrounding a portion of the side surface CD4_s of the fourth core die CD4 may be substantially the same as the horizontal thickness L4 of the first molding layer MD14 surrounding a portion of the side surface CD4_s of the fourth core die CD4.

A horizontal thickness L5 of the fourth vertical portion 644 surrounding a portion of the side surface CD4_*s* of the fourth core die CD4 may be about 20 μm or more and about 100 μm or less. The horizontal thickness L4 of the first molding layer MD14 surrounding a portion of the side surface CD4_*s* of the fourth core die CD4 may be about 20 μm or more and about 100 μm or less. For example, the horizontal thickness L5 of the fourth vertical portion 644 and the horizontal thickness L4 of the first molding layer MD14 may be about 50 μm.

An upper surface 644_*t* of the fourth vertical portion 644 surrounding the side surface CD4_*s* of the fourth core die CD4 may have a convex profile. However, the present inventive concept is not limited thereto, and in some embodiments of the present inventive concept, the upper surface 644_*t* of the fourth vertical portion 644 may be parallel to the upper surface CD4_*t* of the fourth core die CD4 or may have a concave profile.

The lower surface of the first molding layer MD14 and the upper surface 644_*t* of the fourth vertical portion 644 may have complementary profiles. A lower surface of the first molding layer MD14 may have a concave profile. However, the present inventive concept is not limited thereto, and in some embodiments of the present inventive concept, the lower surface of the first molding layer MD14 may be parallel to the upper surface CD4_*t* of the fourth core die CD4 or may have a convex profile.

In some embodiments of the present inventive concept, the lower surface of the first molding layer MD14 and the upper surface of the fourth vertical portion 644 may be between the upper surface and the lower surface of the fourth core die CD4.

Referring back to FIGS. 1 and 2, the semiconductor package 10 includes a second molding layer MD2 surrounding the core die stack CDS and molding the core die stack CDS and the buffer die BD. For example, the second molding layer MD2 may horizontally surround the core die stack CDS, the NCFs 611, 622, 633, and 644, which surrounds the core die stack CDS, and the first molding layers MD11 and MD14. For example, the second molding layer MD2 may horizontally surround the NCFs 612, 623, and 634 bonding the core die stack CDS.

In some embodiments of the present inventive concept, the second molding layer MD2 may include an under portion MD21 filling between the buffer die BD and the first core die CD1, disposed between the buffer die BD and the first core die CD1, and surrounding the first lower solder 121 that mediates electrical connection. The under portion MD21 may contact the lower surface of the first core die CD1 and the upper surface of the buffer die BD. In some embodiments, the second molding layer MD2 may include a side portion MD22 surrounding a side surface of the core die stack CDS.

In some embodiments of the present inventive concept, the second molding layer MD2 may include a material different from an NCF. For example, the second molding layer MD2 may include an EMC. For example, the NCFs disposed between the first to fourth core dies CD1, CD2, CD3, and CD4 might not be disposed between the buffer die BD and the core die stack CDS.

In some embodiments of the present inventive concept, the first molding layers MD11 and MD14 and the second molding layer MD2 may include different materials from each other. In some embodiments of the present inventive concept, even when the first molding layers MD11 and MD14 and the second molding layer MD2 include the same material as each other, contents of materials included in the first and second molding layers MD11 and MD14 and MD2 may be different. Even when the first molding layers MD11 and MD14 and the second molding layer MD2 include the same material as each other, since the first molding layers MD11 and MD14 and the second molding layer MD2 are formed with a time difference therebetween during the manufacturing process of the semiconductor package 10, even if the first molding layers MD11 and MD14 are in contact with the second molding layer MD2, there may be an interface at the contact surface. For example, the first molding layers MD11 and MD14 and the second molding layer MD2 might not appear as a single integral layer, and the second molding layer MD2 may appear as a layer that is distinct from the first molding layers MD11 and MD14.

In some embodiments of the present inventive concept, a fillet pre-semiconductor package may be provided by FIGS. 1, 2, and 3A to 3C.

Figure 4A:
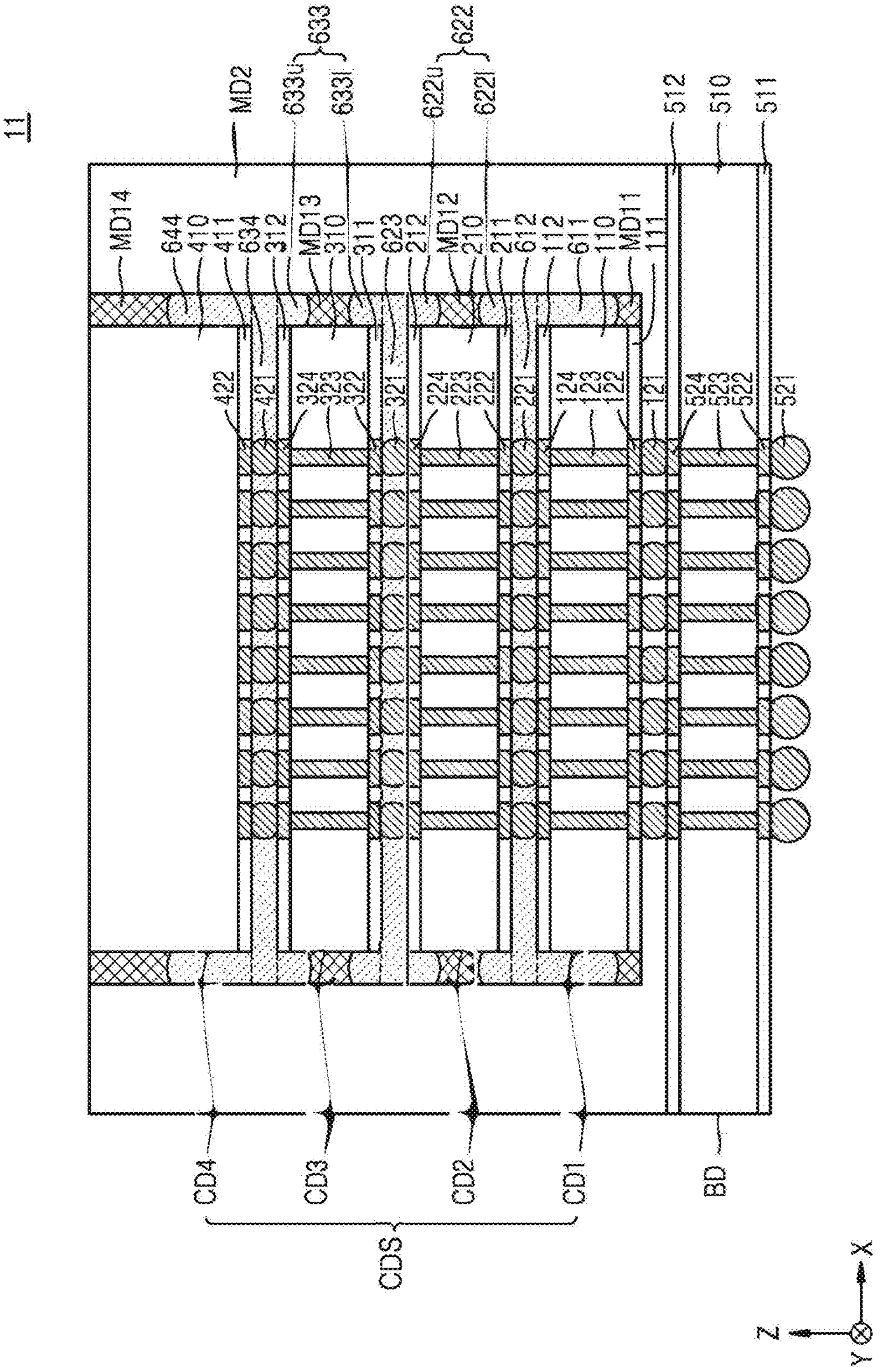
FIGS. 4A, 4B and 4C are cross-sectional views illustrating semiconductor packages according to some embodiments of the present inventive concept.
Figure 4B:
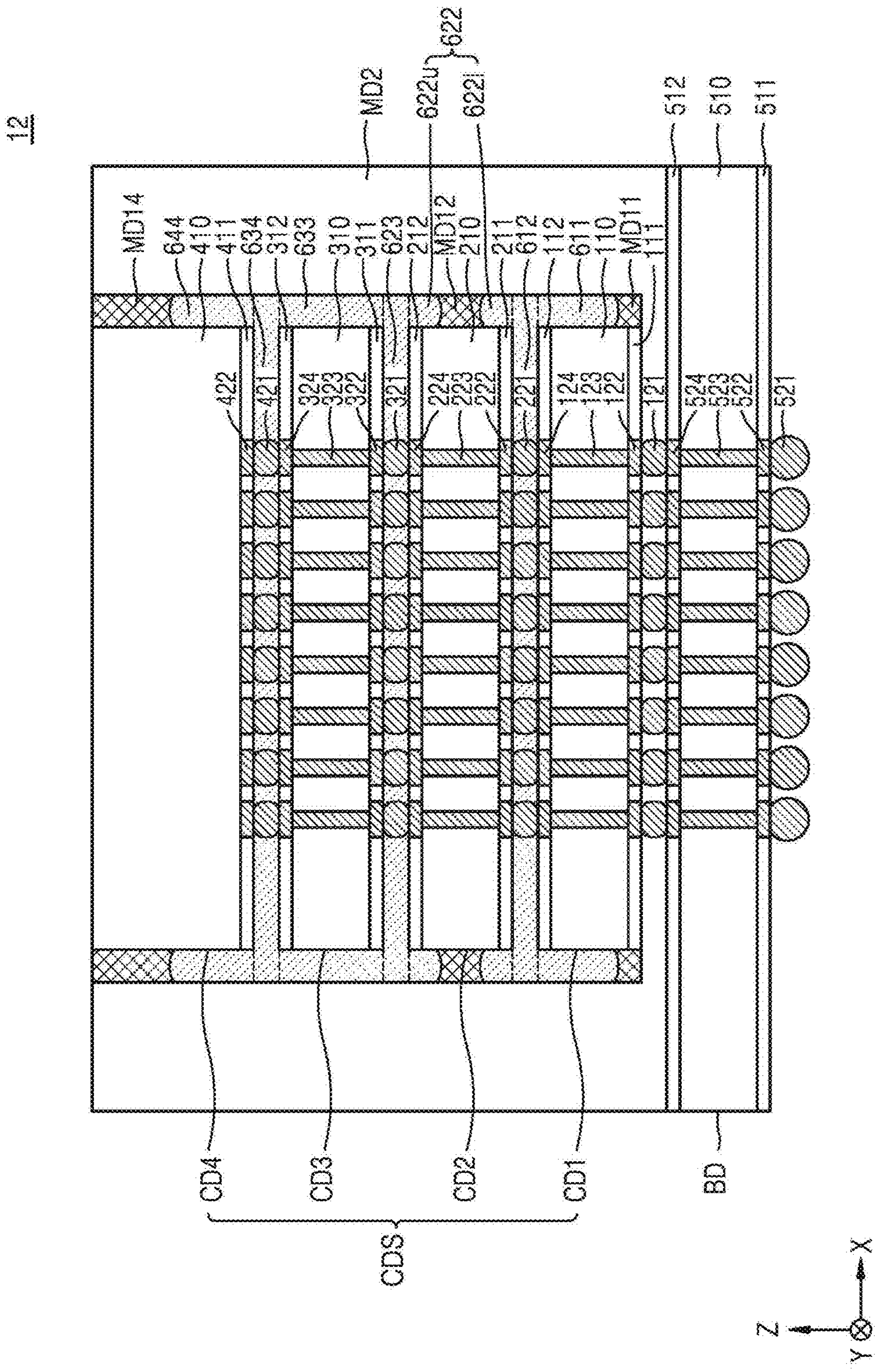
Figure 4C:
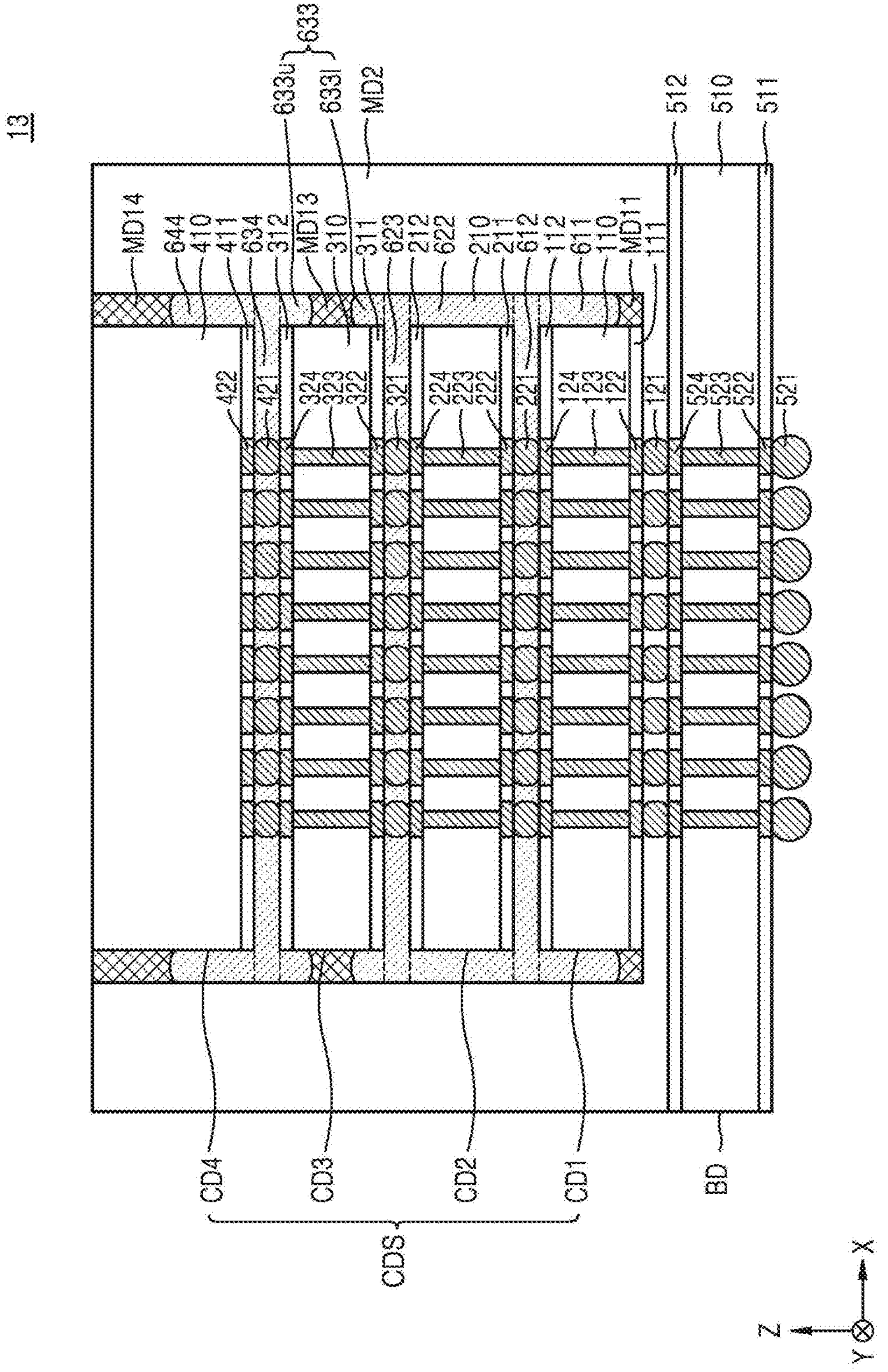
Figure 5A:
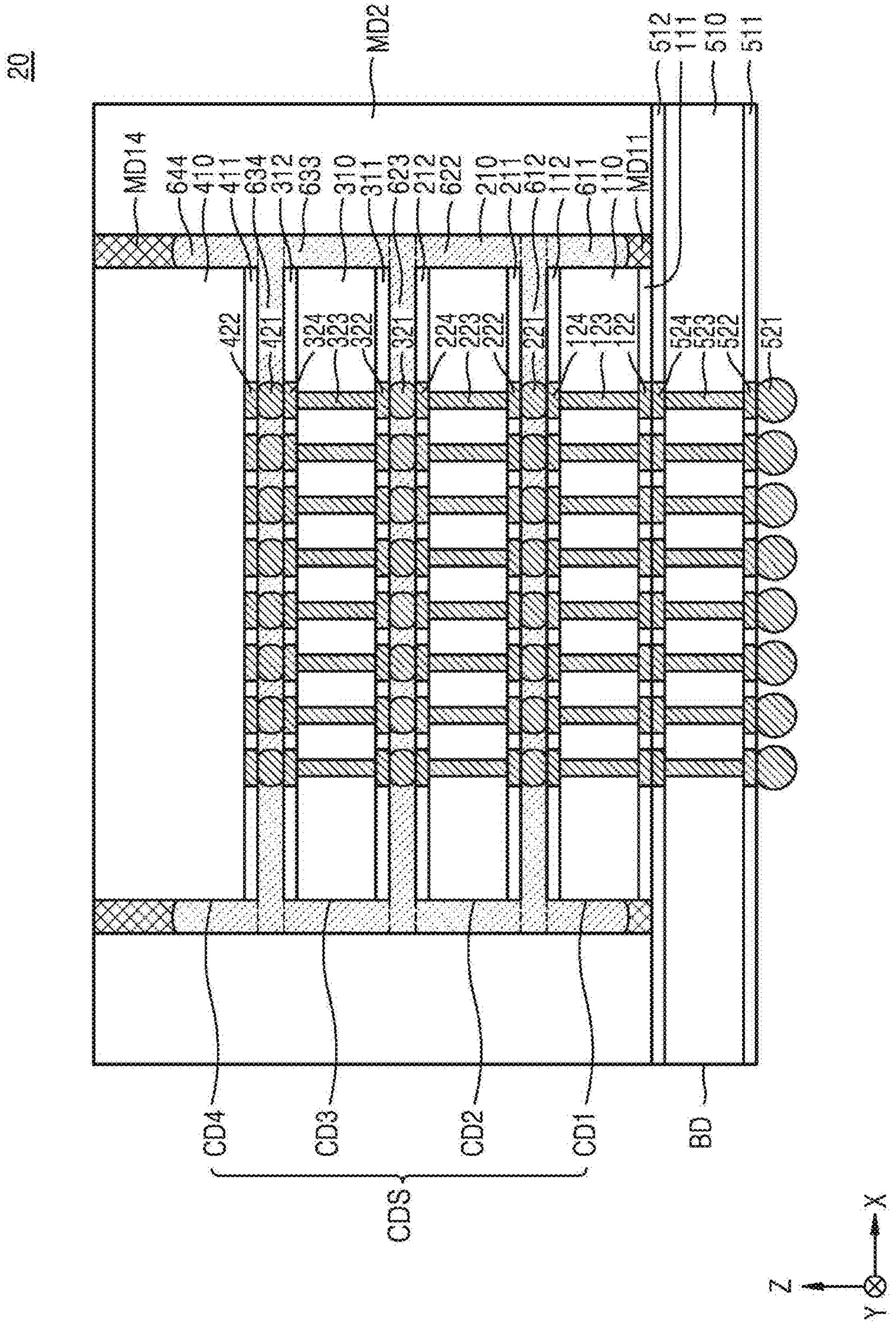
FIGS. 5A, 5B, 5C and 5D are cross-sectional views illustrating semiconductor packages according to some embodiments of the present inventive concept.
Figure 5B:
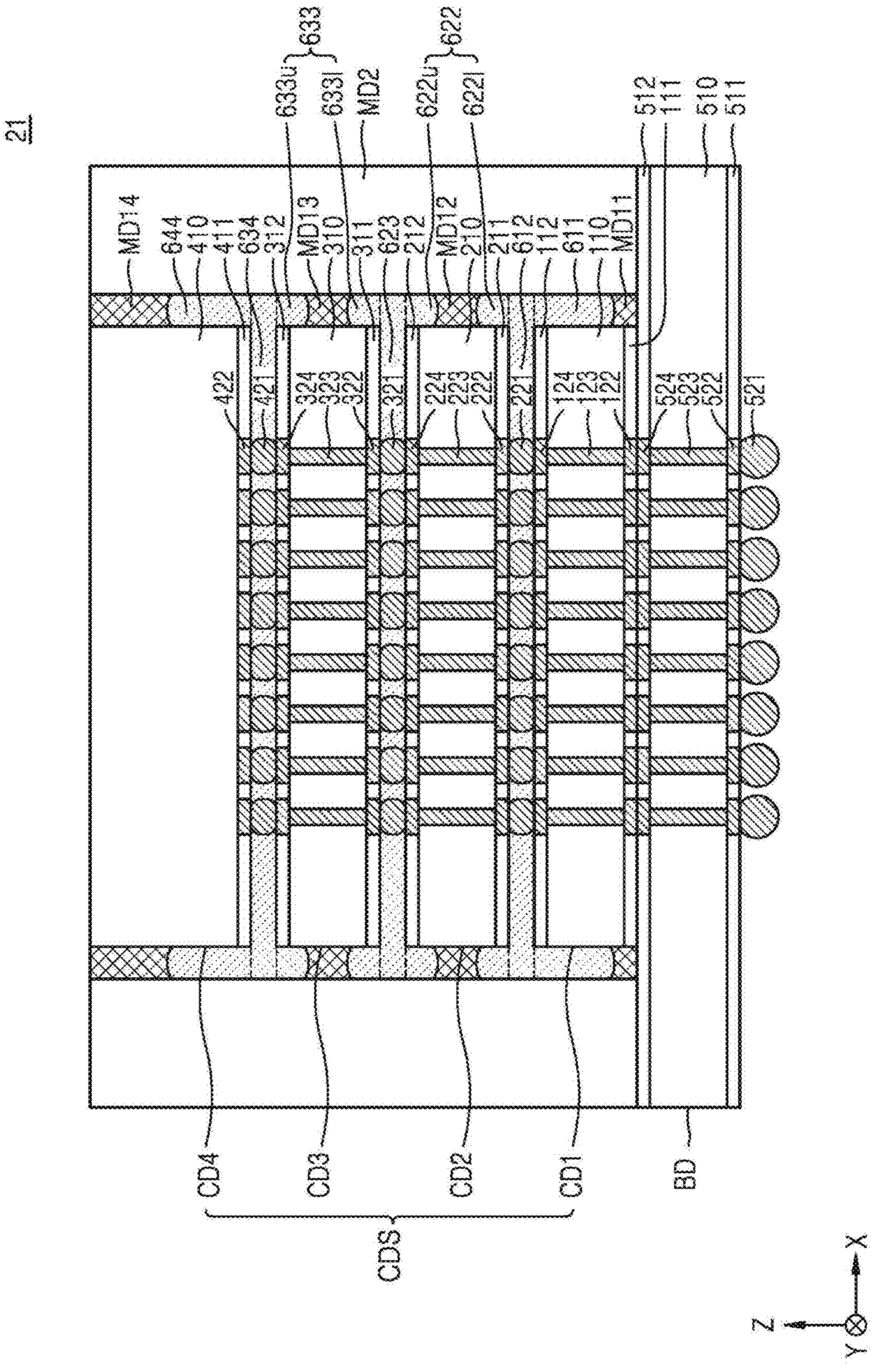
Figure 5C:
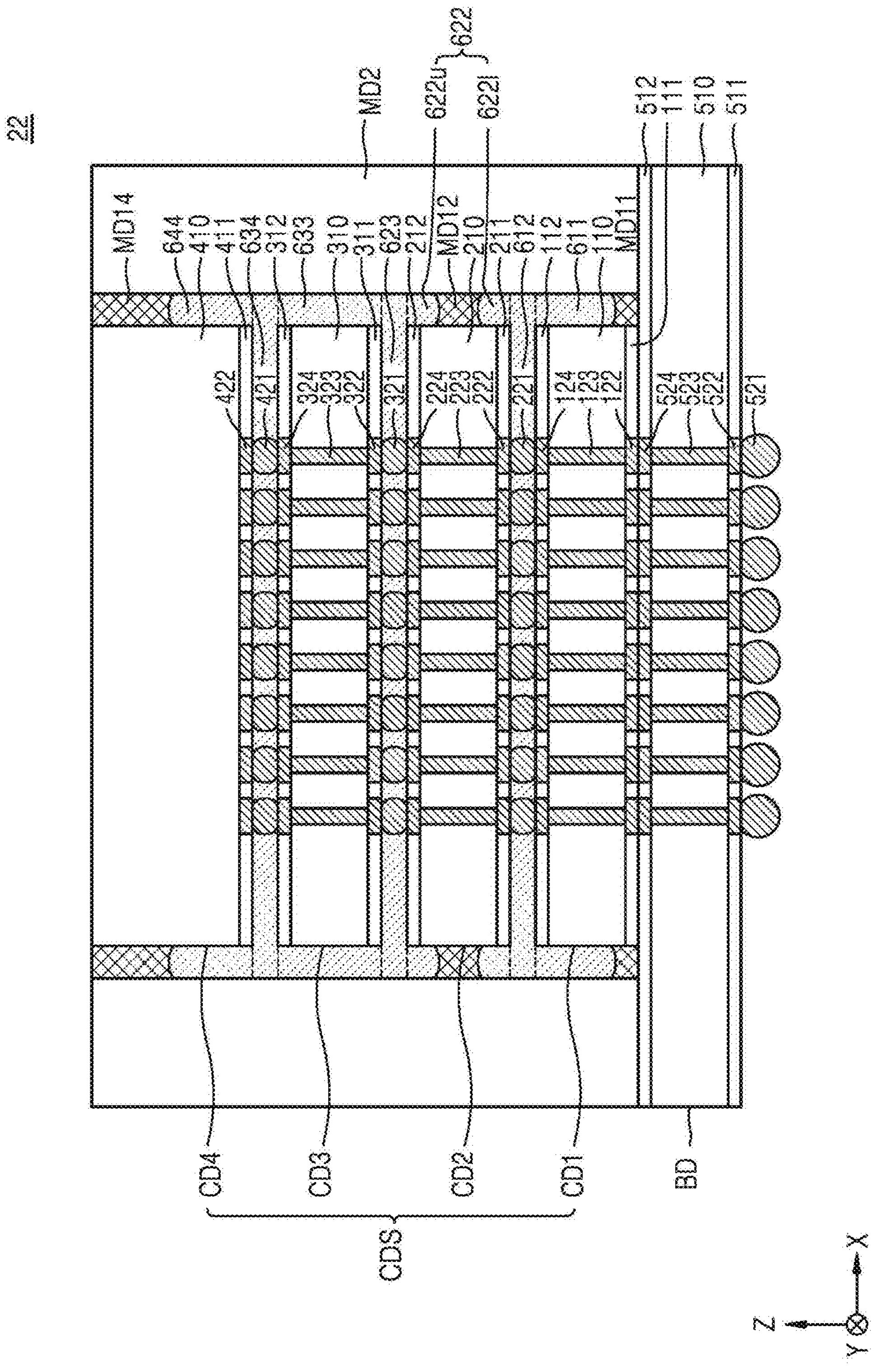
Figure 5D:
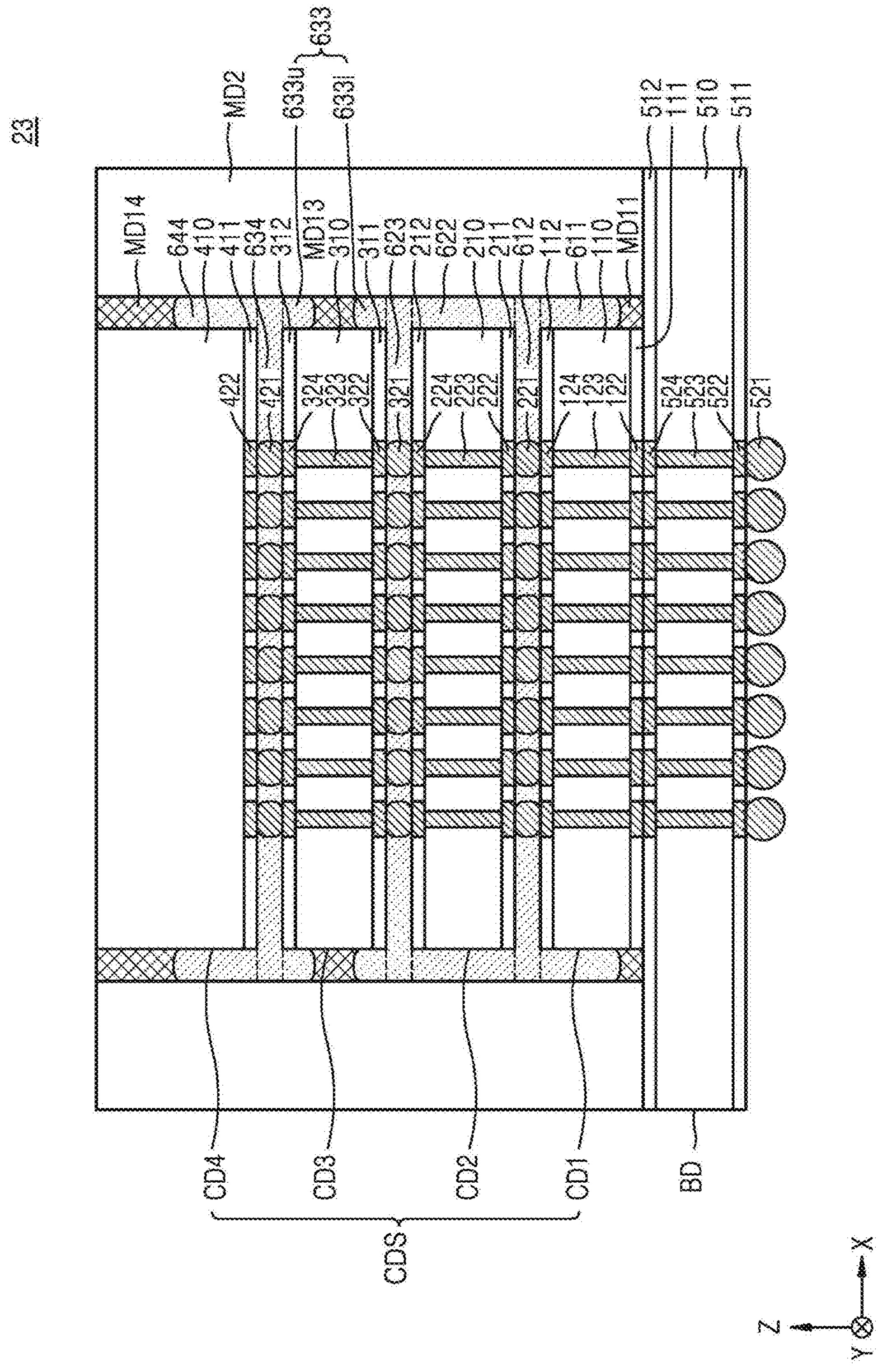

FIGS. 4A to 4C are cross-sectional views illustrating semiconductor packages according to some embodiments of the present inventive concept.

Semiconductor packages 11, 12, and 13 illustrated in FIGS. 4A to 4C may include first molding layers MD12 and MD13 surrounding side surfaces of the second core die CD2 and/or the third core die CD3 unlike the semiconductor package 10 exemplarily shown in FIG. 2.

Referring to FIG. 4A, the semiconductor package 11 may include first molding layers MD12 and MD13 surrounding side surfaces of the second core die CD2 and the third core die CD3. For example, the side surfaces of the second core die CD2 and the third core die CD3 may be partially covered by the NCFs 622 and 633, and a portion other than the portion covered by the NCFs 622 and 633 may be covered by the first molding layers MD12 and MD13.

In some embodiments of the present inventive concept, a side surface of the second core die CD2 may be surrounded by the second vertical portion 622 and the first molding layer MD12. For example, a portion of the side surface of the second core die CD2 may be surrounded by the second vertical portion 622, and the first molding layer MD12 may surround a portion of the side surface other than a portion of the side surface of the second core die CD2 surrounded by the second vertical portion 622. For example, the upper and lower portions of the side surfaces of the second core die CD2 may be surrounded by second vertical portions 622*u* and 622*l*, respectively, and a middle portion of the side surface of the second core die CD2 excluding the upper and lower sides of the side surface of the second core die CD2, which are surrounded by the second vertical portions 622*u* and 622*l*, may be surrounded by the first molding layer MD12. For example, the first molding layer MD12 may be disposed between the second vertical portions 622*u* and 622*l*. In some embodiments of the present inventive concept, the upper surface of the second vertical portion 622*l* that surrounds the lower portion of the side surface of the second core die CD2 may have a convex profile as described with reference to FIG. 3C, and the lower surface of the second vertical portion 622*u* surrounding the upper side of the side surface of the second core die CD2 may have a convex profile as described with reference to FIG. 3A. The upper and lower surfaces of the first molding layer MD12 surrounding the middle portion of the side surface of the second core die CD2 may have a concave profile.

In some embodiments of the present inventive concept, the second vertical portion 622 surrounding the upper or lower side of the side surface of the second core die CD2 may be omitted, and a portion of the side surface of the second core die CD2 that is not surrounded by the second vertical portion 622 may be surrounded by the first molding layer MD12. For example, the second vertical portion 622*u* surrounding the upper portion of the side surface of the second core die CD2 may be omitted, and an upper portion of a side surface of the second core die CD2 may be surrounded by the first molding layer MD12.

In some embodiments of the present inventive concept, a side surface of the third core die CD3 may be surrounded by the third vertical portion 633 and the first molding layer MD13. For example, a portions of the side surface of the third core die CD3 may be surrounded by the third vertical portions 633*u* and 633*l*, and the first molding layer MD13 may surround a portion of the side surface other than the portions of the side surface of the third core die CD3 that are surrounded by the third vertical portions 633*u* and 633*l*. For the description of the first molding layer MD13 surrounding the side surface of the third core die CD3, the above description of the first molding layer MD12 surrounding the side surface of the second core die CD2 may be referred to.

Referring to FIG. 4B, the semiconductor package 12 may include a first molding layer MD12 surrounding a side surface of the second core die CD2. For example, the side surface of the second core die CD2 might not be completely covered by the second vertical portion 622, and a portion other than the portion covered by the second vertical portion 622 may be covered by the first molding layer MD12. For the description of the first molding layer MD12 of the semiconductor package 12, the above description of the first molding layer MD12 of the semiconductor package 11 may be referred to.

Referring to FIG. 4C, the semiconductor package 13 may include a first molding layer MD13 surrounding a side surface of the third core die CD3. For example, the side surface of the third core die CD3 might not be completely covered by the third vertical portion 633, and a portion other than the portion covered by the third vertical portion 633 may be covered by the first molding layer MD13. For the description of the first molding layer MD13 of the semiconductor package 13, the above description of the first molding layer MD13 of the semiconductor package 11 may be referred to.

FIGS. 5A to 5D are cross-sectional views illustrating semiconductor packages 20, 21, 22, and 23 according to some embodiments of the present inventive concept.

Referring to FIGS. 5A to 5D, the buffer upper pad 524 of the buffer die BD may be directly connected to the first lower pad 122 of the first core substrate 110. In some embodiments of the present inventive concept, the buffer upper insulating film 512 of the buffer die BD and the first lower insulating film 111 of the first core die CD1 may be directly bonded to each other.

The buffer die BD and the core die stack CDS of the semiconductor packages 10, 11, 12, and 13 of FIGS. 2 and 4A to 4C are connected by the first lower solder 121 disposed on the lower surface of the first core substrate 110, but in the semiconductor packages 20, 21, 22, and 23 of FIGS. 5A to 5D, the buffer upper pad 524 and the first lower pad 122 may be directly connected to each other. For example, the buffer die BD and the core die stack CDS may be hybrid copper bonded (HCB). For example, the first bonding pad and the second bonding pad connecting the buffer die BD and the core die stack CDS to each other may be metal pads (e.g., Cu), and the first bonding pad and the second bonding pad may be hybrid bonded.

Figure 6:
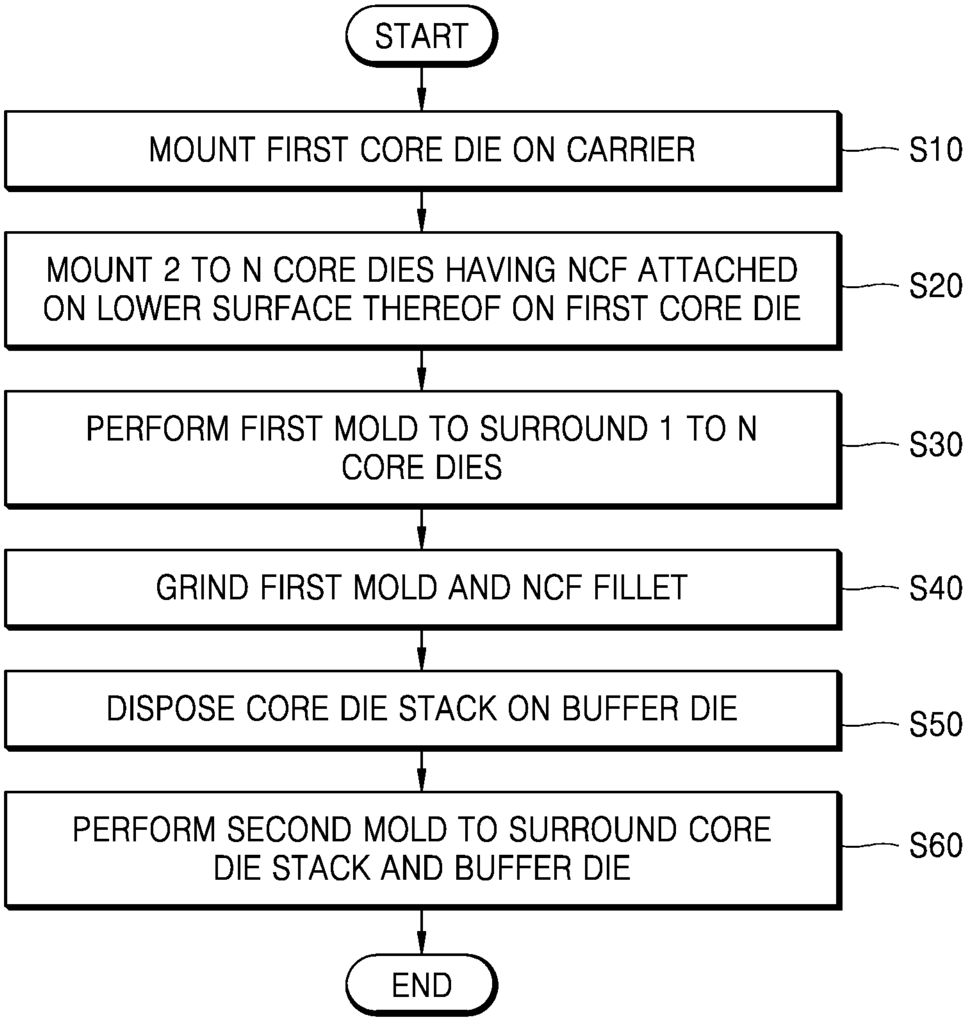
FIG. 6 is a schematic flowchart illustrating a method of manufacturing a semiconductor package, according to some embodiments of the present inventive concept.

FIG. 6 is a schematic flowchart for explaining a method of manufacturing the semiconductor package 10, according to some embodiments of the present inventive concept.

FIGS. 7A to 7H are cross-sectional views illustrating a method of manufacturing the semiconductor package 10, according to some embodiments of the present inventive concept.

Figure 7A:
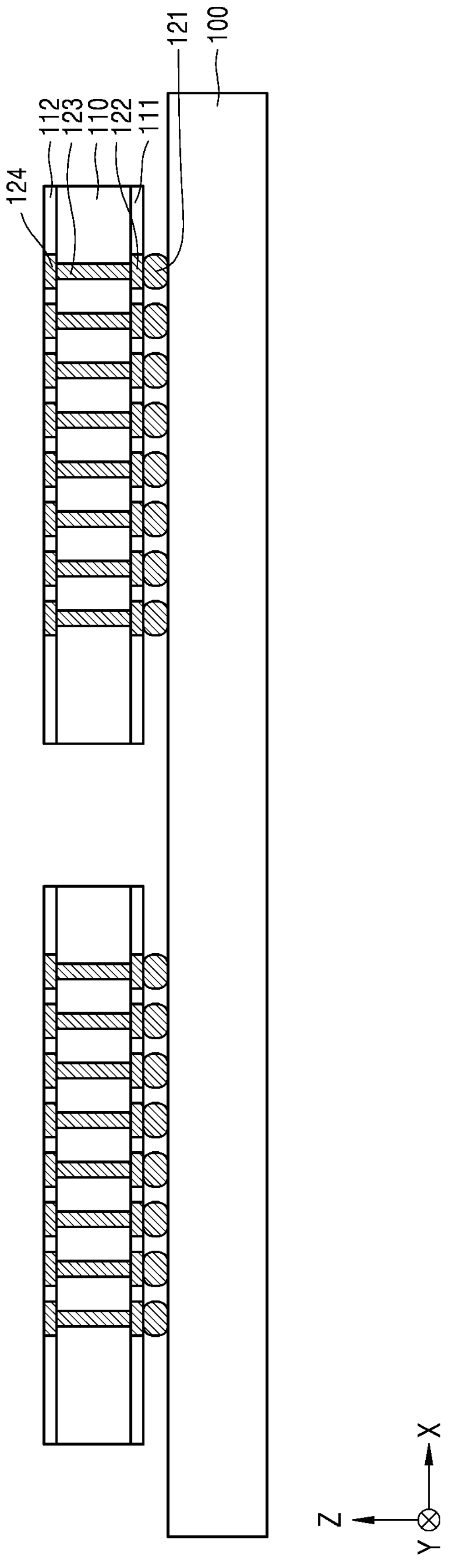
FIGS. 7A, 7B, 7C, 7D, 7E, 7F, 7G and 7H are cross-sectional views illustrating a method of manufacturing a semiconductor package, according to some embodiments of the inventive concept.

Referring to FIGS. 6 and 7A, the first core die CD1 may be mounted on a carrier 100 in S10. A plurality of first core dies CD1 spaced apart in a horizontal direction may be mounted on the carrier 100. The first core die CD1 may include a first core substrate 110, a first lower insulating film 111, a first lower solder 121, a first lower pad 122, a first upper insulating film 112, a first through electrode 123, and a first upper pad 124.

The first core substrate 110 may include, for example, a system LSI, flash memory, DRAM, SRAM, EEPROM, PRAM, MRAM, or ReRAM. The first core substrate 110 may include a plurality of wiring structures for connecting the plurality of individual devices to other wirings formed on the first core substrate 110.

The first through electrode 123 may extend from an upper surface of the first core substrate 110 to a lower surface of the first core substrate 110. At least a portion of the first through electrode 123 may have a columnar shape. The first through electrode 123 may include a barrier film formed on the surface of the column shape and a buried conductive layer filling the inside of the barrier film.

Referring to FIGS. 6 and 7B to 7D, in S20, the second core die CD2 to the fourth core die CD4 having an NCF 601 formed on the lower surface thereof may be mounted on the first core die CD1. Although this specification exemplifies a semiconductor package structure in which four core dies are stacked, in a semiconductor package structure in which N core dies are stacked, N−1 core dies may be disposed on the first core die CDL. Here, N means a natural number of 2 or more.

Figure 7B:
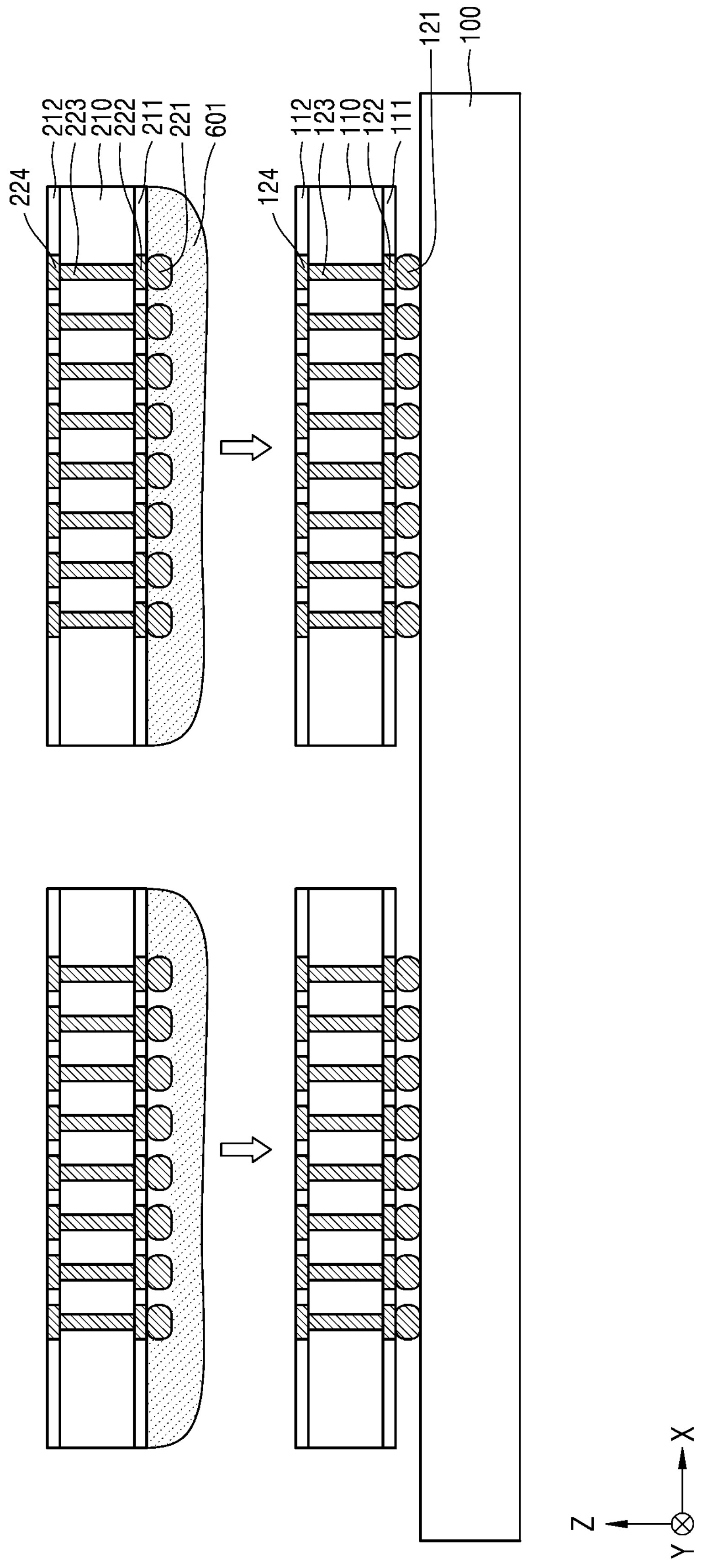

As shown in FIG. 7B, the second core die CD2 having the NCF 601 formed thereon may be disposed on the first core die CD1. The NCF 601 formed on the lower surface of the second core die CD2 may surround the second lower solder 221 and cover the entire lower surface of the second core die CD2.

Figure 7C:
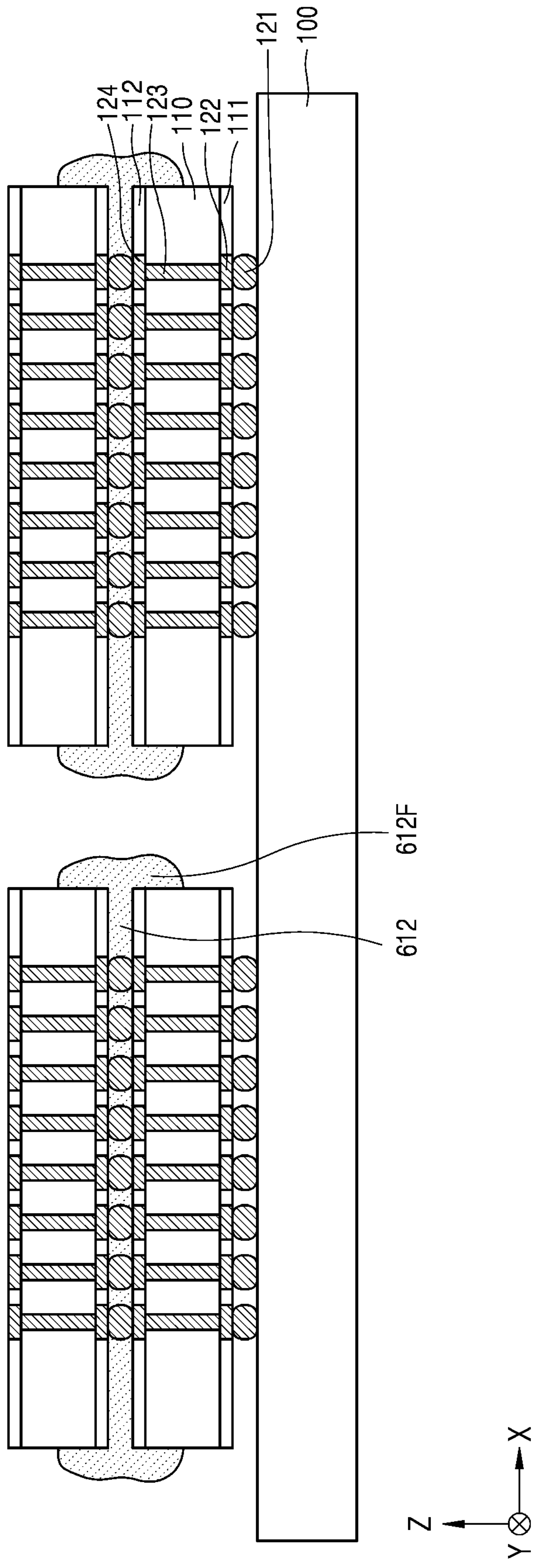

As shown in FIG. 7C, the second core die CD2 may be bonded to the first core die CD1 by a first horizontal portion 612. In this process, for bonding the first core die CD1 to the second core die CD2, by the bonding pressure pressing in the vertical direction (e.g., the Z direction), a portion 612F of the NCF 601 formed on the lower surface of the second core die CD2 may come out of the space between the first core die CD1 and the second core die CD2 to cover a portion of each of the side surfaces of the first core die CD1 and the second core die CD2.

Figure 7D:
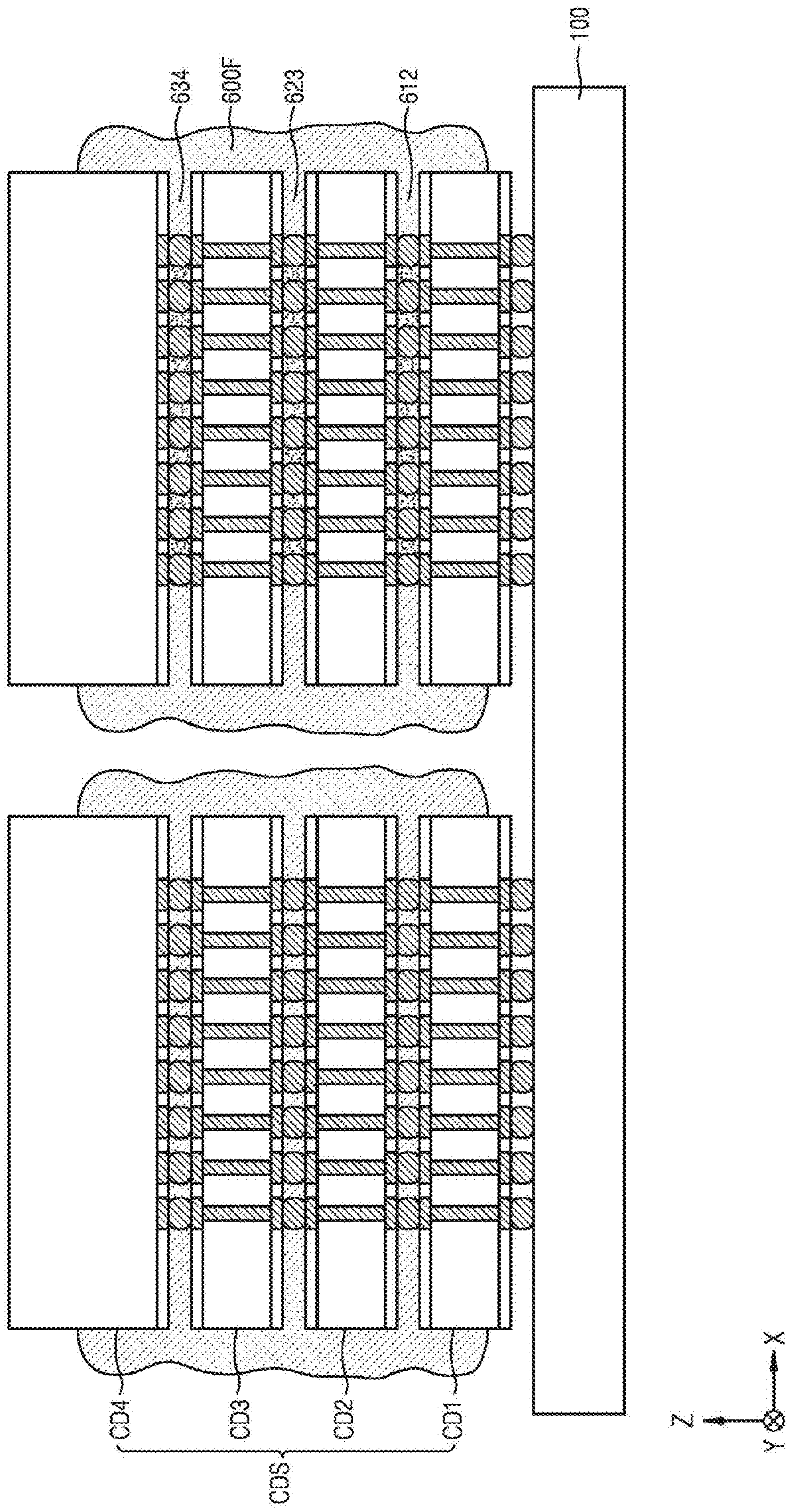

As shown in FIG. 7D, the third core die CD3 and the fourth core die CD4 may be bonded onto the second core die CD2 in the same manner. A second horizontal portion 623 may be disposed between the second core die CD2 and the third core die CD3 to bond the second core die CD2 to the third core die CD3. A third horizontal portion 634 may be disposed between the third core die CD3 and the fourth core die CD4 to bond the third core die CD3 to the fourth core die CD4. In this process, a portion of the NCF bonding the first to fourth core dies CD1, CD2, CD3, and CD4 to each other may cover a portion of side surfaces of the first to fourth core dies CD1, CD2, CD3, and CD4. For example, an NCF fillet 600F surrounding a portion of the side surfaces of the first to fourth core dies CD1, CD2, CD3, and CD4 may be formed. Here, the NCF fillet 600F refers to a portion of the NCF that is laterally protruded from the spaces between the first to fourth core dies CD1, CD2, CD3, and CD4.

Figure 7E:
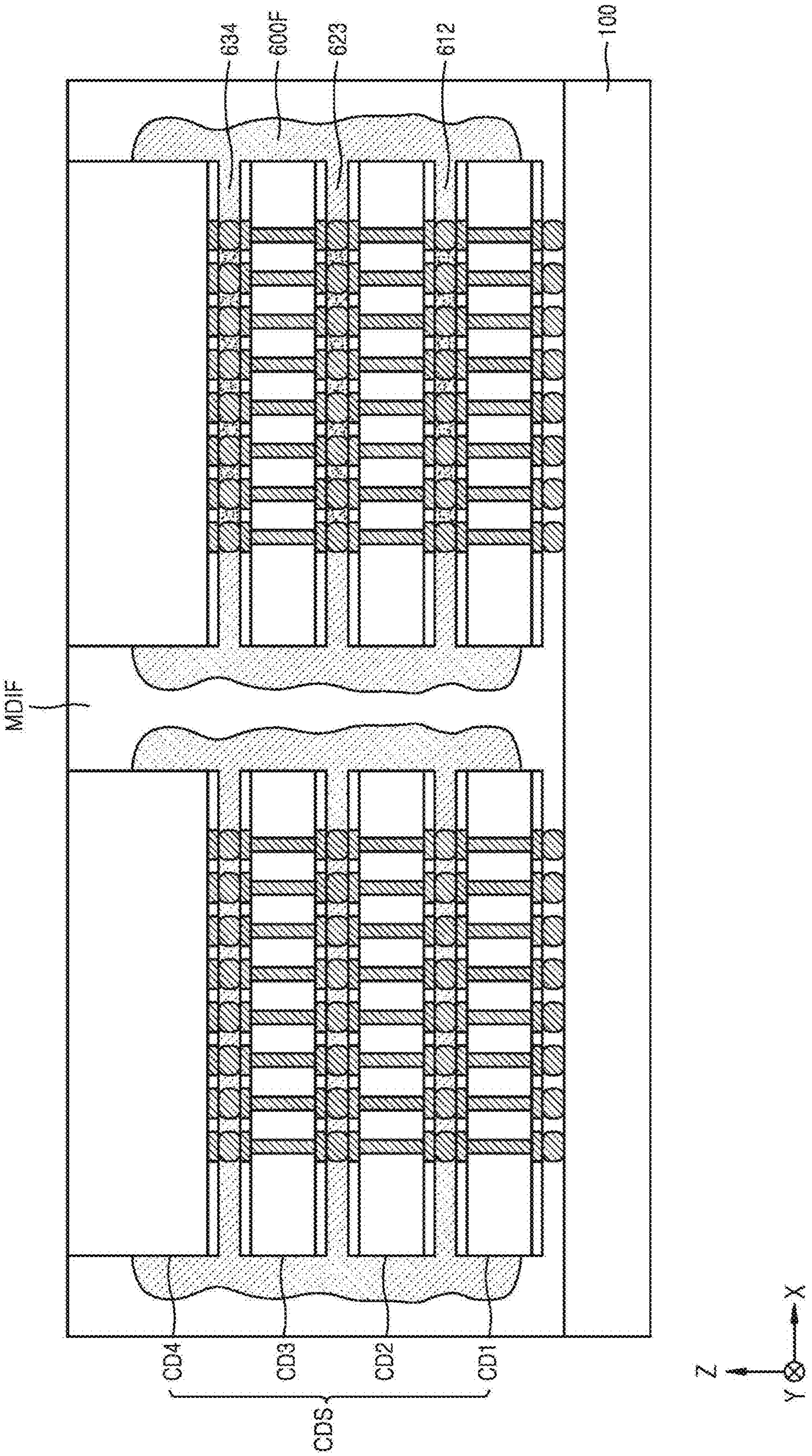

Referring to FIGS. 6 and 7E, a first mold surrounding the first to fourth core dies CD1, CD2, CD3, and CD4 may be performed in S30. Here, the first pre-molding layer MD1F may be formed by the first mold, and may cover all of the first to fourth core dies CD1, CD2, CD3, and CD4 and the NCFs 612, 623, 634, and 600F. The first pre-molding layer MD1F may surround a portion, which is not surrounded by the fillet 600F, among side surfaces of the first to fourth core dies CD1, CD2, CD3, and CD4.

Figure 7F:
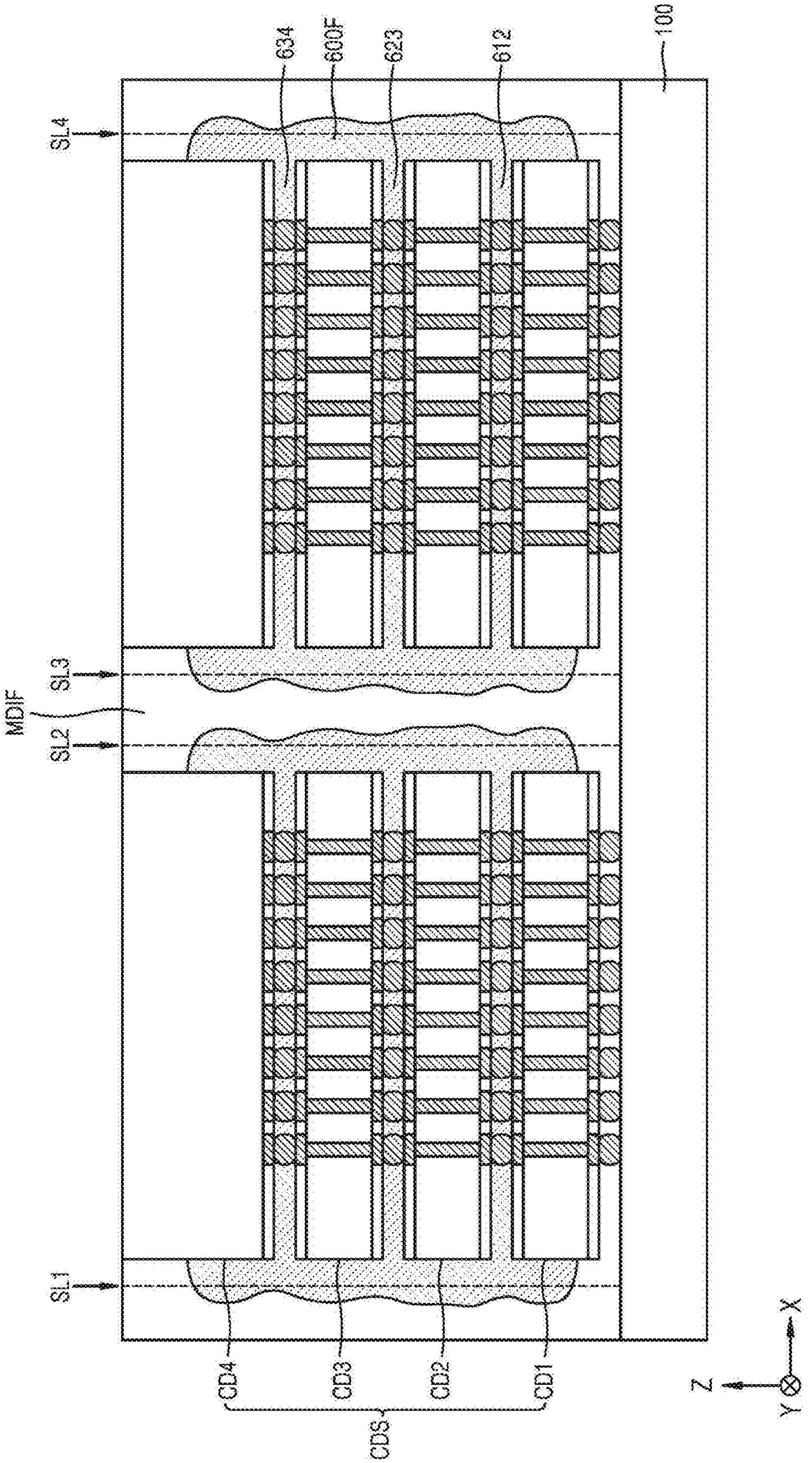

Referring to FIGS. 6 and 7F, the first pre-molding layer MD1F and the NCF fillet 600F may be cut in S40. For example, a blade saw method may be used. For example, grinding may be possible. For example, the first pre-molding layer MD1F and the NCF fillet 600F may be ground along the first to fourth scribe lanes SL1 to SL4. The first pre-molding layer MD1F and the NCF fillet 600F may be ground using a blade. The NCF fillet 600F is removed by grinding the first pre-molding layer MD1F and the NCF fillet 600F, and the first molding layers MD11 and MD14 and the NCFs 611, 622, 633, and 644 of FIG. 7G may be formed.

Figure 7G:
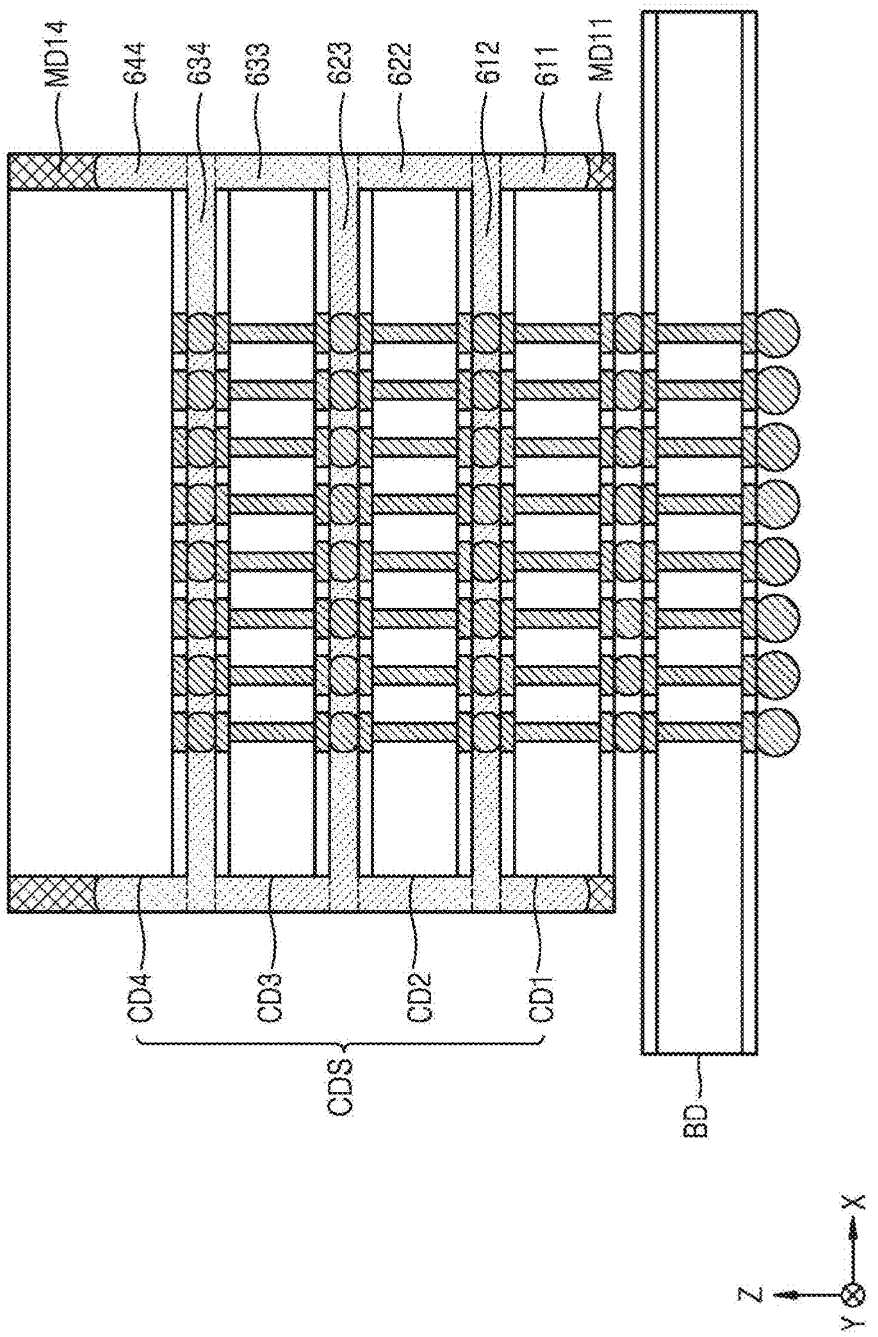

Referring to FIGS. 6 and 7G, in S50, the core die stack CDS may be mounted on the buffer die BD.

As the first pre-molding layer MD1F and the NCF fillet 600F are simultaneously ground in FIG. 7F, the side surfaces of the first molding layers MD11 and MD14 and the side surfaces of the first to fourth vertical portions 611, 622, 633, and 644 of the NCF may be substantially coplanar with one another. For example, the side surface of the first vertical portion 611, which surrounds the side surface of the first core die CD1, and the side surface of the first molding layer MD11 may be aligned with each other. The side surface of the first vertical portion 611, which surrounds the side surface of the first core die CD1, and the side surface of the first molding layer MD11 may be substantially coplanar with one another.

A core die stack CDS including the first molding layers MD11 and MD14 and the first to fourth vertical portions 611, 622, 633, and 644 may be formed as a result of FIG. 7F, and the core die stack CDS may be removed from the carrier 100 of FIG. 7F and disposed on the buffer die BD. For example, the first lower solder 121 (refer to FIG. 2) of the first core die CD1 may be disposed on the buffer upper pad 524 (refer to FIG. 2) of the buffer die BD.

Figure 7H:
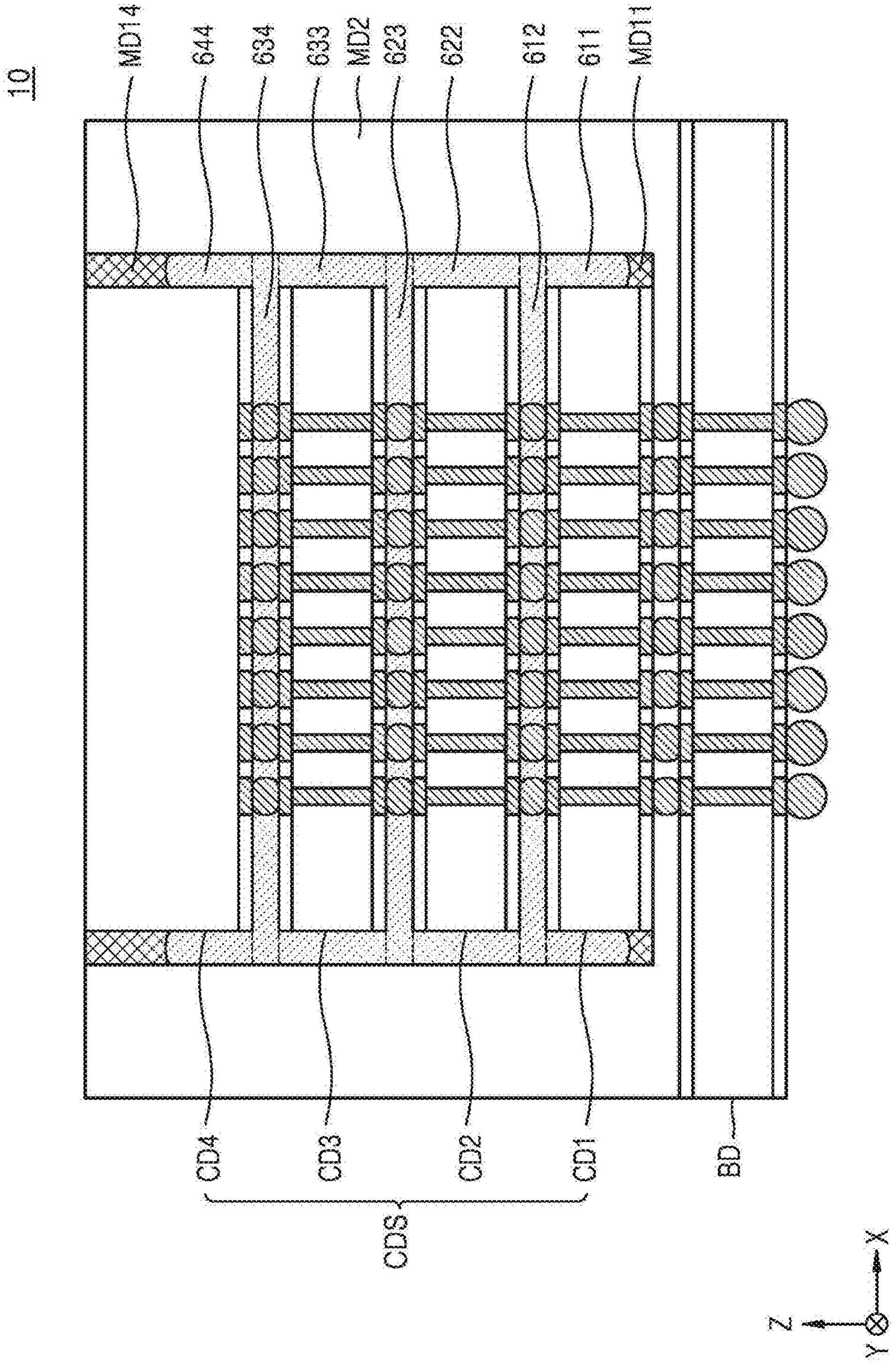

Referring to FIGS. 6 and 7H, the semiconductor package 10 may be manufactured by performing a second mold surrounding the core die stack CDS and the buffer die BD in S60. A second molding layer MD2 may be formed by the second mold.

As a portion of the NCF fillet 600F is removed by grinding the first pre-molding layer MD1F and the NCF fillet 600F, appearance defects that may occur when the NCF fillet 600F is exposed to the outside of the semiconductor package 10 may be prevented. In addition, reliability problems due to cracks that may be formed in the NCF fillet 600F may be prevented.

In addition, reliability problems such as warpage defects that may occur because the EMC coefficient of thermal expansion (CTE) of the NCF fillet 600F and the second molding layer MD2 are different may be prevented. Accordingly, according to embodiments of the present inventive concept, it is possible to provide a semiconductor package with increased reliability and a method of manufacturing the same.

The manufacturing method of the semiconductor package 10 of FIGS. 1, 2 and 3A to 3C has been described above, but based on the description described above, a person skilled in the art may easily manufacture the semiconductor packages 11, 12, 13, 20, 21, 22, 23 shown in FIGS. 4A to 4C, 5A to 5D in substantially the same manner.

Figure 8:
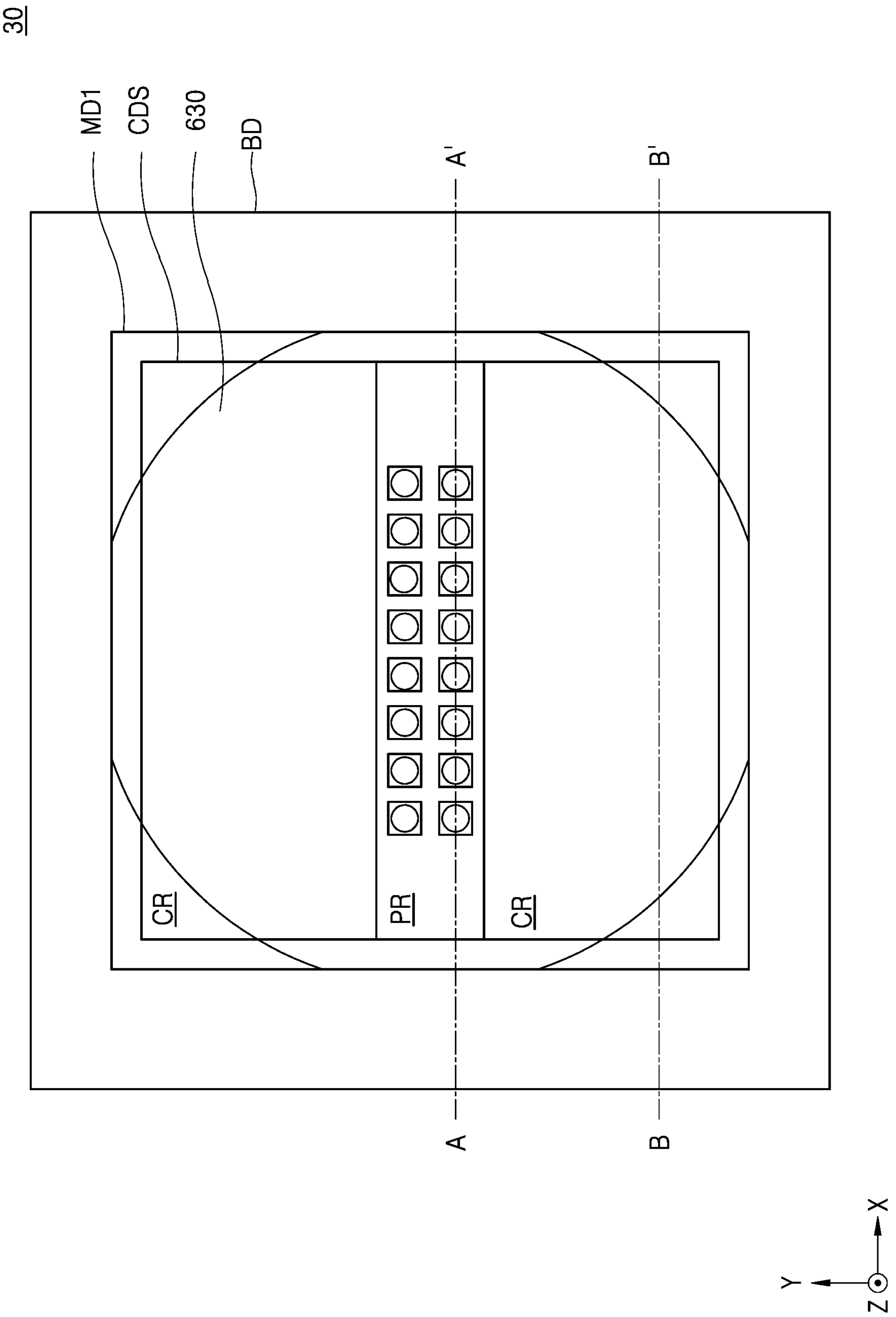
FIG. 8 is a layout diagram illustrating a semiconductor package according to an embodiment of the present inventive concept.
Figure 9A:
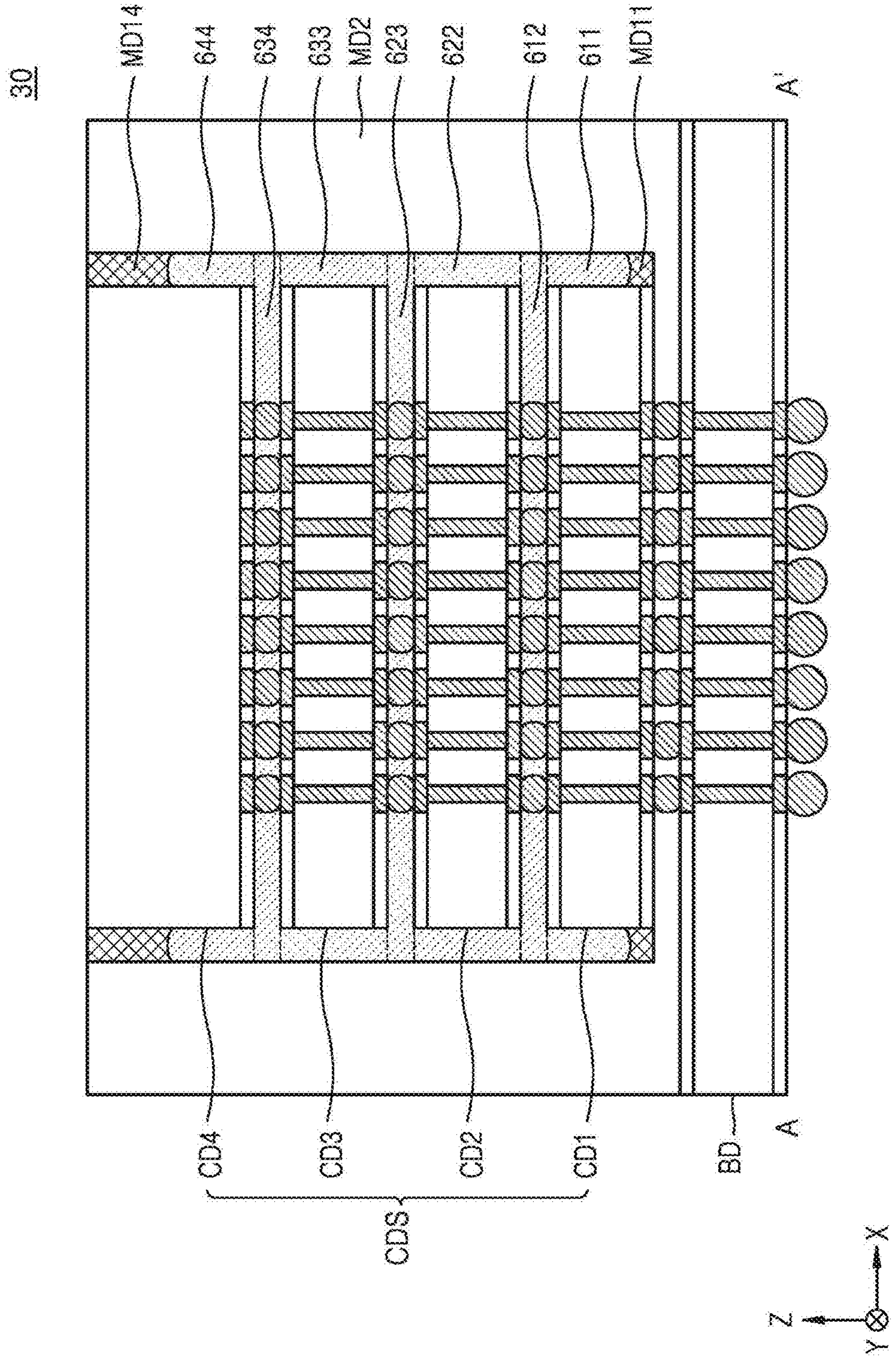
FIG. 9A is a cross-sectional view taken along line A-A' of FIG. 9.
Figure 9B:
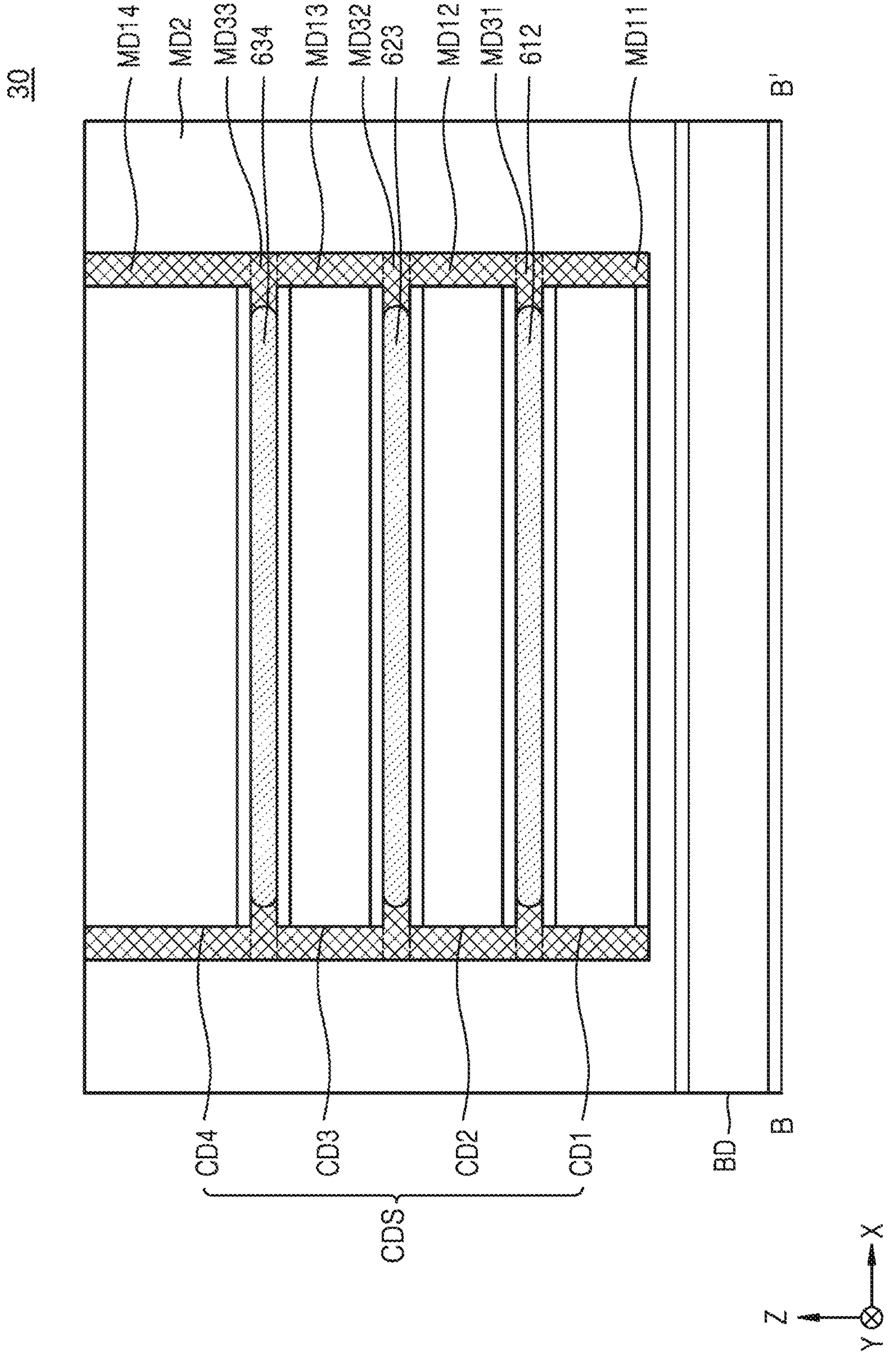
FIG. 9B is a cross-sectional view taken along line B-B' of FIG. 9.

FIG. 8 is a layout diagram illustrating a semiconductor package 40 according to some embodiments of the present inventive concept. FIG. 9A is a cross-sectional view taken along line A-A' of FIG. 8. FIG. 9B is a cross-sectional view taken along line B-B' of FIG. 8.

Referring to FIG. 8, unlike the semiconductor package 10 (see FIGS. 1 and 2), the NCF 630 of the semiconductor package 30 might not be disposed in some regions between the first to fourth core dies CD1, CD2, CD3, and CD4.

Referring to FIG. 9A, a cross-sectional view taken along line A-A' of the semiconductor package 30 may be substantially the same as a cross-sectional view taken along line A-A' of the semiconductor package 10. For example, the NCF may be disposed in all regions between the first to fourth core dies CD1, CD2, CD3, and CD4 in the cross-sectional view.

Referring to FIG. 9B, the NCF might not be disposed in some regions between the first to fourth core dies CD1, CD2, CD3, and CD4. For example, the first horizontal portion 612 might not be disposed in some regions between the first core die CD1 and the second core die CD2, particularly, in an edge region. The second horizontal portion 623 might not be disposed in some regions between the second core die CD2 and the third core die CD3, particularly, an edge region. The third horizontal portion 634 might not be disposed in some regions between the third core die CD3 and the fourth core die CD4, particularly, an edge region. This is because the amount of NCF attached to the lower surfaces of the second core die CD2 to the fourth core die CD4 during the manufacturing process of the semiconductor package 30 is insufficient, or the lower surfaces of the second core die CD2 to the fourth core die CD4 are not completely covered by the NCF during the manufacturing process.

In some embodiments of the present inventive concept, sides of the first to fourth core dies CD1, CD2, CD3, and CD4 might not be surrounded by the NCF. When the NCF is not disposed in some region between the first to fourth core dies CD1, CD2, CD3, and CD4 like the semiconductor package 30, NCFs might not be placed in the lateral spaces of the plurality of core dies CD1, CD2, CD3, CD4 either.

In some embodiments of the present inventive concept, side surfaces of the first to fourth core dies CD1, CD2, CD3, and CD4 may be surrounded by the first molding layers MD11, MD12, MD13, and MD14. As described above, the sides of the first to fourth core dies CD1, CD2, CD3, and CD4 might not be surrounded by the NCF, and the first molding layers MD11, MD12, MD13, and MD14 surrounding the first to fourth core dies CD1, CD2, CD3, and CD4 and the horizontal portions 612, 623, and 634 may all surround sides of the first to fourth core dies CD1, CD2, CD3, and CD4.

In some embodiments of the present inventive concept, the third molding layers MD31, MD32, and MD33 may be disposed between the first to fourth core dies CD1, CD2, CD3, and CD4. The third molding layers MD31, MD32, and MD33 may be formed simultaneously with the first molding layers MD11, MD12, MD13, and MD14. The third molding layers MD31, MD32, and MD33 may include the same material as the first molding layers MD11, MD12, MD13, and MD14. The third molding layers MD31, MD32, and MD33 and the first molding layers MD11, MD12, MD13, and MD14 might not include an interface. In the process of forming the first molding layers MD11, MD12, MD13, and MD14 surrounding the first to fourth core dies CD1, CD2, CD3, and CD4 and the horizontal portions 612, 623, and 634, the third molding layers MD31, MD32, and MD33 may be formed while filling some regions between the first to fourth core dies CD1, CD2, CD3, and CD4 in which NCFs are not disposed.

Figure 10A:
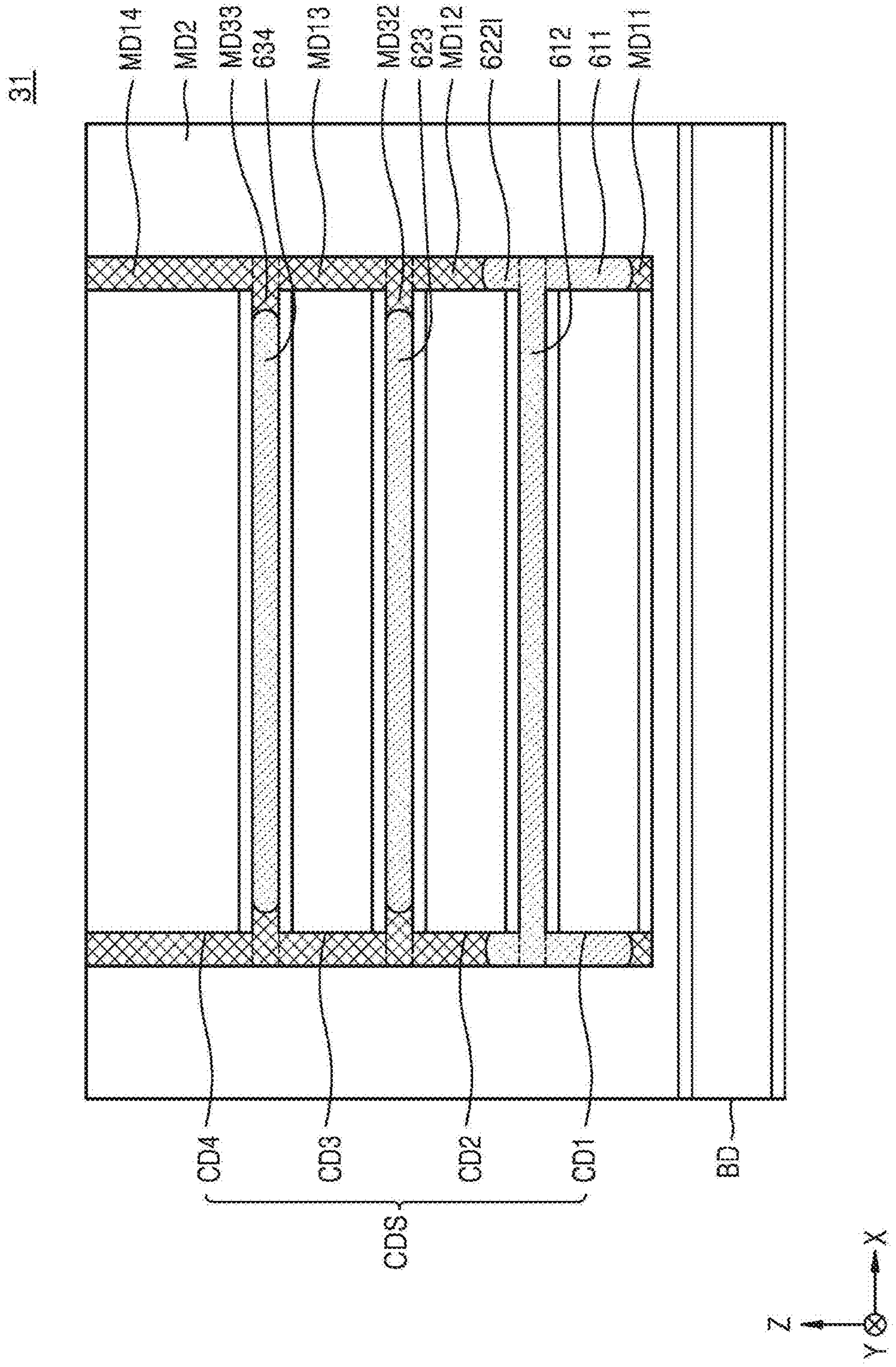
FIGS. 10A, 10B and 10C are cross-sectional views illustrating semiconductor packages according to some other embodiments of the present inventive concept.
Figure 10B:
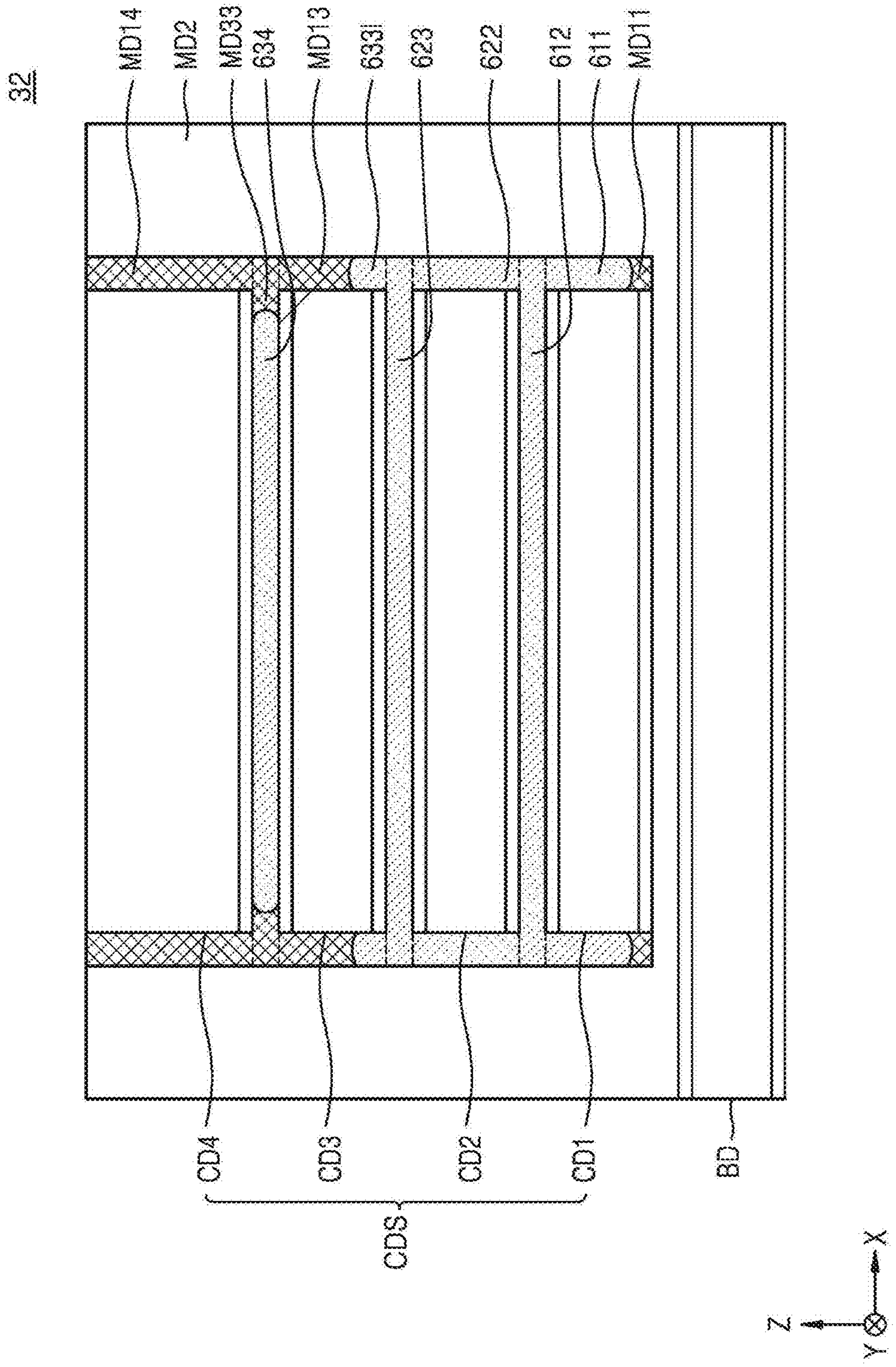
Figure 10C:
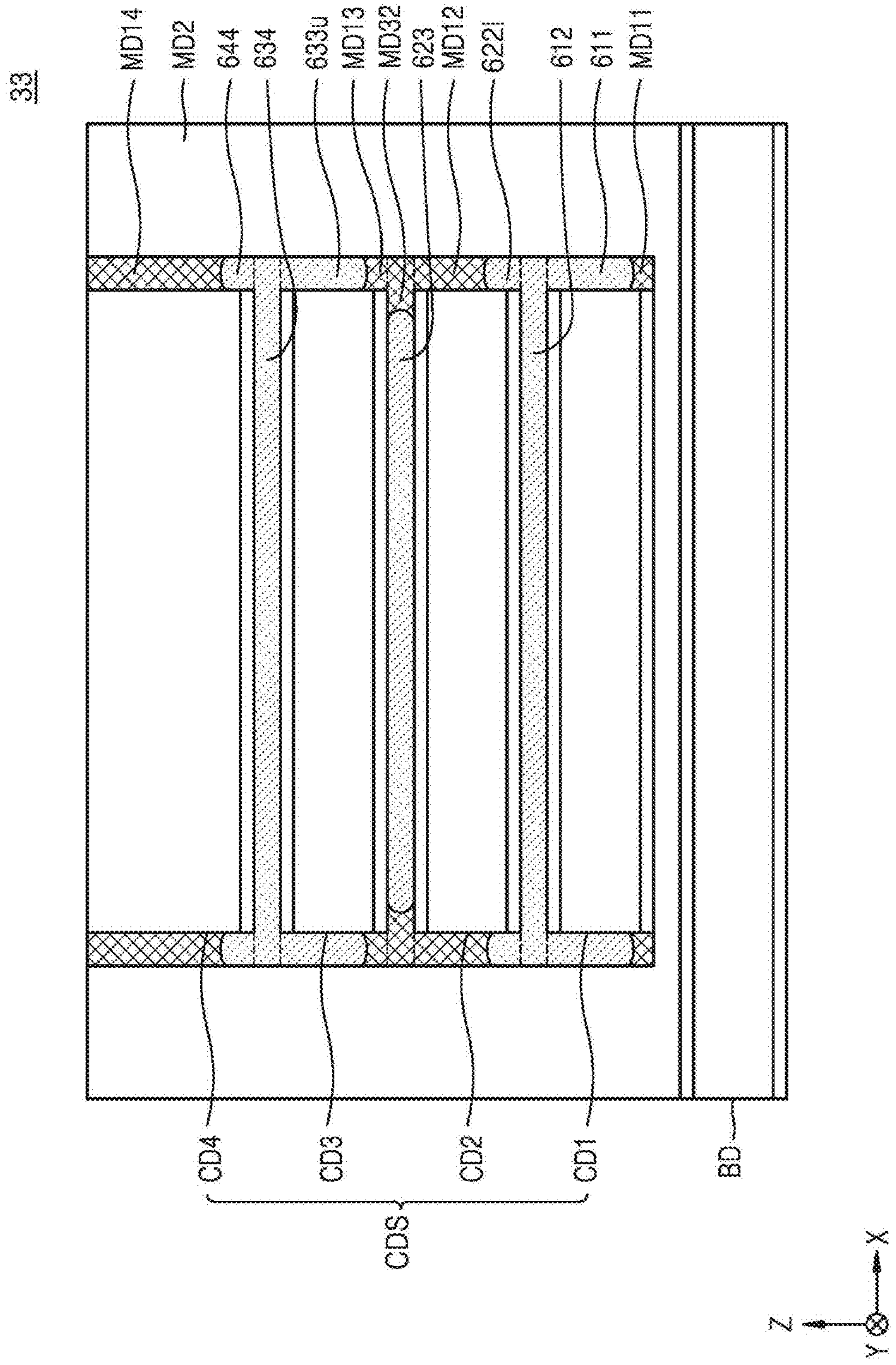

FIGS. 10A to 10C are cross-sectional views illustrating semiconductor packages 31, 32, and 33 according to some embodiments of the present inventive concept.

The semiconductor packages 31, 32, and 33 shown in FIGS. 10A to 10C include vertical portions 611, 622, 633, and 644 surrounding portions of side surfaces of the first to fourth core dies CD1, CD2, CD3, and CD4, unlike the semiconductor package 30 shown in FIG. 9B.

Referring to FIG. 10A, while the second horizontal portion 623 and the third horizontal portion 634 are not disposed in some regions between the second core die CD2 to the fourth core die CD4 of the semiconductor package 31, a first horizontal portion 612 may be disposed in all regions between the first core die CD1 and the second core die CD2.

In some embodiments of the present inventive concept, a first vertical portion 611, which surrounds a portion of a side surface of the first core die CD1, and a second vertical portion 622*l*, which surrounds a portion of a side surface of the second core die CD2, may be disposed. The second vertical portion 622*l* may be disposed to surround a lower portion of a side surface of the second core die CD2. In some embodiments of the present inventive concept, the first vertical portion 611 might not completely surround the side surface of the first core die CD1, and a first molding layer MD11 surrounding a remaining portion of a side surface of the first core die CD1 may be disposed. In some embodiments of the present inventive concept, the second vertical portion 622*l* might not completely surround the side surface of the second core die CD2, and a first molding layer MD12 surrounding a remaining portion of a side surface of the second core die CD2 may be disposed.

In some embodiments of the present inventive concept, third molding layers MD32 and MD33 may be disposed in some region where the second horizontal portion 623 and the third horizontal portion 634 between the second core die CD2 to the fourth core die CD4 are not disposed. Since the first horizontal portion 612 may be disposed in all areas between the first core die CD1 and the second core die CD2, the third molding layer MD31 (refer to FIG. 10B) might not be disposed between the first core die CD1 and the second core die CD2.

Referring to FIG. 10B, while the third horizontal portion 634 is not disposed in some region between the third core die CD3 and the fourth core die CD4 of the semiconductor package 32, a first horizontal portion 612 and a second horizontal portion 623 may be disposed in all regions between the first core die CD1 to the third core die CD3.

In some embodiments of the present inventive concept, a first vertical portion 611 surrounding a portion of a side surface of the first core die CD1, a second vertical portion 622 surrounding a portion of a side surface of the second core die CD2, and a third vertical portion 633*l* surrounding a portion of a side surface of the third core die CD3 may be disposed. The third vertical portion 633*l* may be disposed to surround a lower portion of a side surface of the third core die CD3. In some embodiments of the present inventive concept, as shown in the drawing, a side surface of the second core die CD2 is completely surrounded by the second vertical portion 622 so that the first molding layer MD12 (refer to FIG. 10B) covering the side surface of the second core die CD2 might not be disposed. In addition, in some embodiments of the present inventive concept, unlike what is shown, the side surface of the second core die CD2 might not be completely surrounded by the second vertical portion 622, and a first molding layer MD12 surrounding a remaining portion of a side surface of the second core die CD2 may be disposed.

In some embodiments of the present inventive concept, the third molding layer MD33 may be disposed in some regions between the third core die CD3 and the fourth core die CD4 where the third horizontal portion 634 is not disposed. Since the first horizontal portion 612 and the second horizontal portion 623 may be disposed in all areas between the first core die CD1 and the second core die CD2 and between the second core die CD2 and the third core die CD3, the third molding layers MD32 and MD33 (refer to FIG. 10B) might not be disposed between the first core die CD1 and the second core die CD2 and between the second core die CD2 and the third core die CD3.

Referring to FIG. 10C, while the second horizontal portion 623 is not disposed in some regions between the second core die CD2 and the third core die CD3 of the semiconductor package 33, the first and third horizontal portions 612 and 634 may be disposed in all regions between the first core die CD1 and the second core die CD2 and between the third core die CD3 and the fourth core die CD4.

In some embodiments of the present inventive concept, a first vertical portion 611 surrounding a portion of a side surface of the first core die CD1, a second vertical portion 622*l* surrounding a portion of a side surface of the second core die CD2, a third vertical portion 633*u* surrounding a portion of a side surface of the third core die CD3, and a fourth vertical portion 644 surrounding a portion of a side surface of the fourth core die CD4 may be disposed. The second vertical portion 622*l* may be disposed to surround a lower portion of a side surface of the second core die CD2. The third vertical portion 633*u* may be disposed to surround an upper portion of a side surface of the third core die CD3.

In some embodiments of the present invention, the third molding layer MD32 may be disposed in some regions between the second core die CD2 and the third core die CD3 where the second horizontal portion 623 is not disposed. Since the first horizontal portion 612 may be disposed in all regions between the first core die CD1 and the second core die CD2 and since the third horizontal portion 634 may be disposed in all regions between the third core die CD3 and the fourth core die CD4, the third molding layers MD31 and MD33 (refer to FIG. 10B) might not be disposed.

Figure 11:
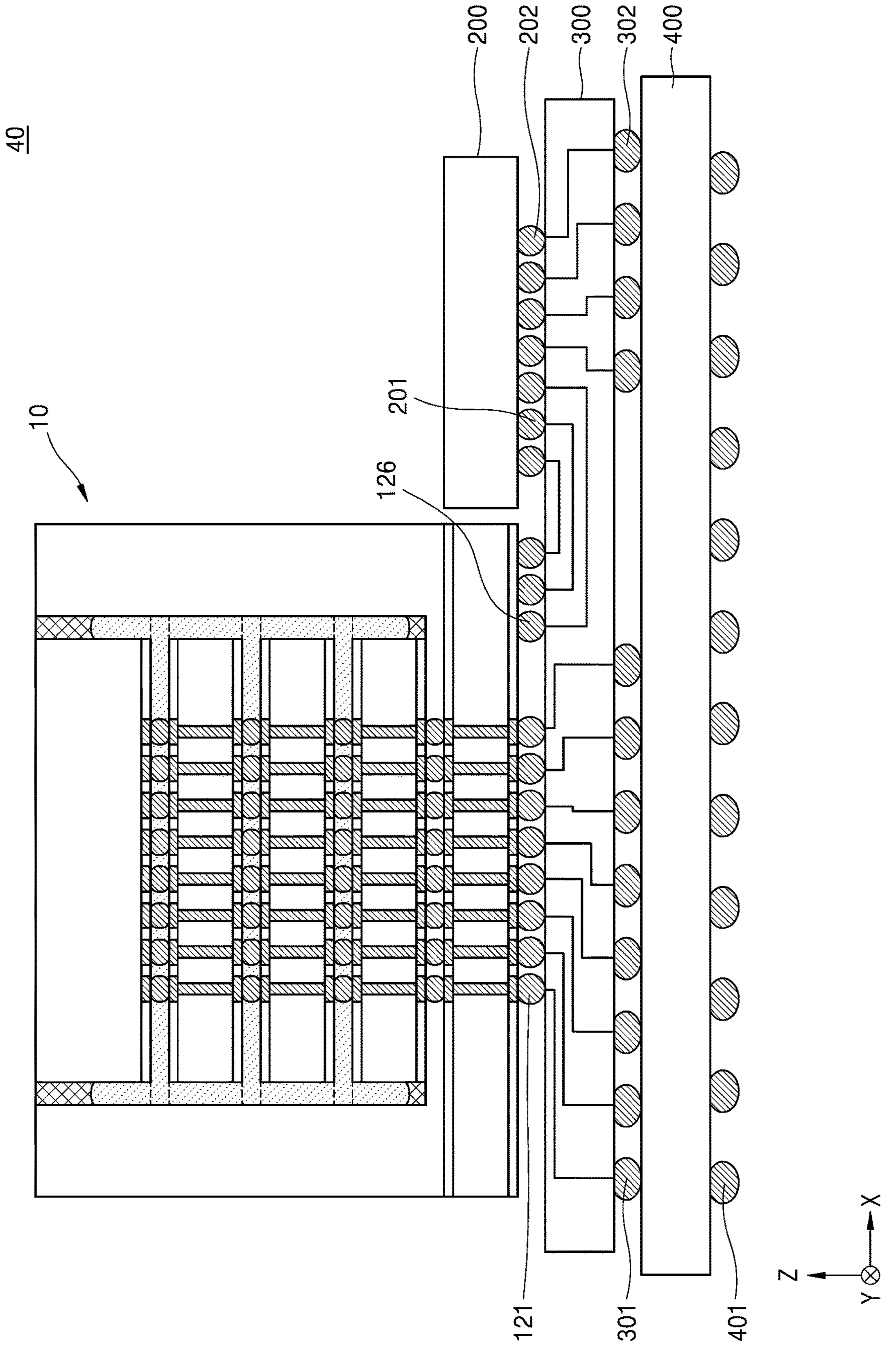
FIG. 11 is a cross-sectional view illustrating semiconductor packages according to some embodiments of the present inventive concept.

FIG. 11 is a cross-sectional view illustrating a semiconductor package 40 according to some embodiments of the present inventive concept.

Referring to FIG. 11, the semiconductor package 40 may include a semiconductor package 10, a processor 200, an interposer 300, and a package substrate 400.

The semiconductor package 10 may be substantially the same as the semiconductor package described with reference to FIGS. 1 to 3C.

The semiconductor package 10 may be electrically connected to the interposer 300 by the buffer lower solder 521. The electrical signal of the semiconductor package 10 may be transmitted to the package substrate 400 through wiring formed in the interposer 300. The electrical signal of the semiconductor package 10 may be fan-out by the interposer 300.

The semiconductor package 10 may be electrically connected to the processor 200 through the buffer connection terminal 126. The buffer connection terminal 126 of the semiconductor package 10 may be electrically connected to the first processor connection terminal 201 attached to the lower surface of the processor 200. The electrical signal of the semiconductor package 10 may be transmitted to the processor 200 through wiring formed in the interposer 300.

The processor 200 may be electrically connected to the interposer 300 by the second processor connection terminal 202. The electrical signal of the processor 200 may be transmitted to the package substrate 400 through wiring formed in the interposer 300.

The processor 200 may include a device for controlling the semiconductor package 10. The processor 200 may include, for example, a central processing unit (CPU), a graphics processing unit (GPU), and a system on chip (SOC) die.

The interposer 300 may include a substrate base made of a semiconductor material, and upper and lower pads respectively formed on upper and lower surfaces of the substrate base. The substrate base may be formed from, for example, a silicon wafer. In addition, internal wiring may be formed on the upper surface, lower surface, or inside of the substrate base. In addition, through vias electrically connecting the upper pads to the lower pads may be formed in the substrate base.

A first interposer connection terminal 301 and a second interposer connection terminal 302 may be attached to a lower surface of the interposer 300. The first interposer connection terminal 301 and the second interposer connection terminal 302 may be attached to, for example, the lower pads. The first interposer connection terminal 301 and the second interposer connection terminal 302 may be, for example, solder balls or bumps. The first interposer connection terminal 301 may be a connection terminal for electrically connecting the semiconductor package 10 to the package substrate 400. The second interposer connection terminal 302 may be a connection terminal for electrically connecting the processor 200 to the package substrate 400.

The package substrate 400 may be, for example, a printed circuit board or a ceramic substrate. When the package substrate 400 is a printed circuit board, the package substrate 400 may include a substrate base and upper and lower pads respectively formed on upper and lower surfaces. The upper pads and the lower pads may be exposed by a solder resist layer covering the upper and lower surfaces of the substrate base, respectively. The substrate base may be made of at least one of a phenol resin, an epoxy resin, and/or a polyimide. For example, the substrate base may include, for example, at least one of Frame Retardant 4 (FR4), Tetrafunctional epoxy, Polyphenylene ether, Epoxy/polyphenylene oxide, Bismaleimide triazine (BT), Thermount, Cyanate ester, Polyimide, and/or Liquid crystal polymer. The upper pads and the lower pads may be made of, for example, copper, nickel, stainless steel, or beryllium copper. Internal wiring may be formed in the substrate base to electrically connect the upper pads to the lower pads. Each of the upper pads and the lower pads may be a portion exposed by the solder resist layer in the circuit wiring patterned after coating the upper and lower surfaces of the substrate base with copper (Cu) foil.

An external connection terminal 401 may be attached to a lower surface of the package substrate 400. The external connection terminal 401 may be attached to, for example, the lower pads. The external connection terminal 401 may be, for example, a solder ball or a bump. The external connection terminal 401 may electrically connect the semiconductor package 30 to an external device. For example, the external connection terminal 401 may include under bump metal (UBM) patterns disposed on the lower pads and solder balls disposed on the UBM patterns. The external connection terminal 401 may further include an external connection pillar disposed between the UBM patterns and the solder balls. The external connection pillar may include, for example, copper.

While the present inventive concept has been described with reference to embodiments thereof, it will be understood by those of ordinary skill in the art that various changes in form and details may be made thereto without departing from the spirit and scope of the present inventive concept.

What is claimed is:

1. A semiconductor package comprising:

a buffer die;

a first core die disposed on the buffer die;

a second core die disposed on the first core die;

a first non-conductive film (NCF) disposed between the first core die and the second core die and configured for thermocompression bonding the first core die and the second core die to each other;

a first molding layer at least partially surrounding a side surface of the first core die; and a second molding layer surrounding the first NCF and the first molding layer, wherein the first core die, the second core die, and the buffer die are disposed on the second molding layer, wherein a side surface of the first molding layer and a side surface of the first NCF form a coplanar surface.

2. The semiconductor package of claim 1, wherein the first molding layer comprises a portion surrounding a lower portion of a side surface of the first core die.

3. The semiconductor package of claim 1, wherein the first molding layer is spaced apart from an upper portion of a side surface of the first core die.

4. The semiconductor package of claim 1, wherein the first NCF comprises a portion surrounding an upper portion of a side surface of the first core die.

5. The semiconductor package of claim 1, wherein a thickness of a portion surrounding an upper portion of a side surface of the first core die of the first NCF is about 20 μm or more and about 100 μm or less in a horizontal direction.

6. The semiconductor package of claim 1, further comprising a first lower solder disposed between the buffer die and the first core die and electrically connecting the buffer die to the first core die, wherein the second molding layer comprises:

an under portion filling a space between the buffer die and the first core die and at least partially surrounding the first lower solder; and a side portion surrounding a side surface of the first core die, wherein the second molding layer comprises a material different from that of the first NCF.

7. The semiconductor package of claim 1, wherein the buffer die comprises a buffer upper pad disposed on a first surface, of the buffer die, facing the first core die, wherein the first core die comprises a first lower pad disposed on a first surface, of the first core die, facing the buffer die, wherein the buffer upper pad and the first lower pad are directly connected to each other.

8. The semiconductor package of claim 7, wherein the buffer die further comprises a buffer upper insulating film exposing the buffer upper pad, wherein the first core die further comprises a first lower insulating film exposing the first lower pad, wherein the buffer upper insulating film and the first lower insulating film are directly bonded to each other.

9. The semiconductor package of claim 1, wherein the first molding layer has a concave upper surface.

10. The semiconductor package of claim 1, further comprising:

a third core die disposed on the second core die;

a second NCF configured for thermocompression bonding the third core die to the second core die; and a third molding layer surrounding a side surface of the third core die, wherein the second molding layer horizontally surrounds the third core die, the second NCF, and the third molding layer, wherein a side surface of the third molding layer is coplanar with a side surface of the second NCF.

11. The semiconductor package of claim 10, wherein a side surface of the third molding layer is coplanar with a side surface of the first molding layer.

12. The semiconductor package of claim 10, wherein the first NCF and the second NCF are spaced apart from each other with the second core die therebetween.

13. The semiconductor package of claim 10, further comprising a fourth molding layer surrounding a side surface of the second core die.

14. The semiconductor package of claim 10, wherein the first NCF covers a lower portion of a side surface of the second core die, and wherein the second NCF covers an upper portion of a side surface of the second core die.

15. The semiconductor package of claim 10, wherein the first NCF and the second NCF are integrally formed in direct contact with each other.

16. A semiconductor package comprising:

a buffer die;

a first core die disposed on the buffer die;

a second core die disposed on the first core die;

a non-conductive film (NCF) disposed between the first core die and the second core die and configured for thermocompression bonding the first core die and the second core die to each other;

a first molding layer at least partially surrounding a side surface of the second core die; and a second molding layer that surrounds the NCF and the first molding layer and molds the first core die, the second core die, and the buffer die, wherein a side surface of the first molding layer and a side surface of the NCF form a coplanar surface.

17. The semiconductor package of claim 16, wherein the first molding layer comprises a portion surrounding an upper portion of a side surface of the second core die.

18. The semiconductor package of claim 16, wherein the NCF comprises a portion surrounding a lower portion of a side surface of the second core die.

19. The semiconductor package of claim 16, wherein the first molding layer has a concave surface.

20. A semiconductor package comprising:

a buffer die;

a core die stack disposed on the buffer die, and including a first core die disposed on the buffer die, a second core die disposed on the first core die, and a third core die disposed on the second core die;

a non-conductive film (NCF) configured for thermocompression bonding the core die stack;

a first molding layer at least partially surrounding a portion of a side surface of the core die stack; and a second molding layer surrounding the core die stack, the NCF, and the first molding layer, and molding the core die stack and the buffer die, wherein the NCF comprises:

a first horizontal portion disposed between the first core die and the second core die;

a second horizontal portion disposed between the second core die and the third core die; and a vertical portion at least partially surrounding a side surface of the first core die and a side surface of the second core die and connecting the first horizontal portion to the second horizontal portion, and wherein a side surface of the first molding layer and a side surface of the vertical portion of the NCF form a coplanar surface.

* * * * *